(12) United States Patent
Nakamura et al.

(10) Patent No.: US 10,923,632 B2
(45) Date of Patent: *Feb. 16, 2021

(54) LIGHT EMITTING ELEMENT AND LIGHT EMITTING DEVICE

(71) Applicant: NICHIA CORPORATION, Anan (JP)

(72) Inventors: Akihiro Nakamura, Anan (JP); Keiji Emura, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/835,725

(22) Filed: Mar. 31, 2020

(65) Prior Publication Data

US 2020/0227593 A1 Jul. 16, 2020

Related U.S. Application Data

(63) Continuation of application No. 16/277,243, filed on Feb. 15, 2019, now Pat. No. 10,644,203.

(30) Foreign Application Priority Data

| Feb. 16, 2018 | (JP) | 2018-026347 |
| Oct. 17, 2018 | (JP) | 2018-195754 |
| Jan. 25, 2019 | (JP) | 2019-011449 |

(51) Int. Cl.
*H01L 33/38* (2010.01)
*H01L 33/62* (2010.01)
(Continued)

(52) U.S. Cl.
CPC ............ *H01L 33/385* (2013.01); *H01L 33/32* (2013.01); *H01L 33/38* (2013.01); *H01L 33/387* (2013.01);
(Continued)

(58) Field of Classification Search
CPC ............ H01L 33/36–387; H01L 33/62; H01L 33/405; H01L 33/385; H01L 33/387
See application file for complete search history.

(56) References Cited

U.S. PATENT DOCUMENTS 6,977,395 B2   12/2005   Yamada et al.
8,653,551 B2   2/2014   Fujimori et al.
(Continued)

FOREIGN PATENT DOCUMENTS

| JP | 2011-192960 A | 9/2011 |
| JP | 2016-032009 A | 3/2016 |

(Continued)

OTHER PUBLICATIONS

Notice of Allowance in U.S. Appl. No. 16/277,243, dated Jan. 15, 2020.

*Primary Examiner* — Jose R Diaz
(74) *Attorney, Agent, or Firm* — Foley & Lardner LLP

(57) ABSTRACT

A light emitting element includes a semiconductor structure including a first layer including a first and a second regions, and a second layer above the second region, the first region including extending portions each extending into the second region from an outer peripheral region; a first insulating layer including first through-holes respectively located on the extending portions, and a second through-hole located above the second region; a second insulating layer including a third and a fourth through-holes; a first external electrode connected with the first layer via the first through-holes; and a second external electrode connected with the second layer via the second through-hole. The extending portions are each located in an area, on a top surface of the first layer, other than an area overlapping any of corner portions of the first external electrode and other than an area overlapping any of corner portions of the second external electrode.

43 Claims, 11 Drawing Sheets

(51) Int. Cl.
    *H01L 33/32*         (2010.01)
    *H01L 33/50*         (2010.01)
    *H01L 33/58*         (2010.01)

(52) U.S. Cl.
    CPC ............ *H01L 33/62* (2013.01); *H01L 33/505* (2013.01); *H01L 33/58* (2013.01)

(56) References Cited

U.S. PATENT DOCUMENTS

| | | |
|---|---|---|
| 9,252,562 B2 | 2/2016 | Hayakawa et al. |
| 9,614,126 B2 * | 4/2017 | Kageyama .............. H01L 33/38 |
| 2011/0198641 A1 | 8/2011 | Yahata et al. |
| 2016/0225956 A1 | 8/2016 | Kawai et al. |
| 2017/0110629 A1 | 4/2017 | Suh et al. |
| 2019/0097085 A1 | 3/2019 | Tomizawa et al. |

FOREIGN PATENT DOCUMENTS

| | | |
|---|---|---|
| JP | 2016-143682 A | 8/2016 |
| JP | 2016-208012 A | 12/2016 |
| JP | 2017-092477 A | 5/2017 |
| JP | 2017-520925 A | 7/2017 |
| WO | WO-2017/154975 A1 | 9/2017 |

* cited by examiner

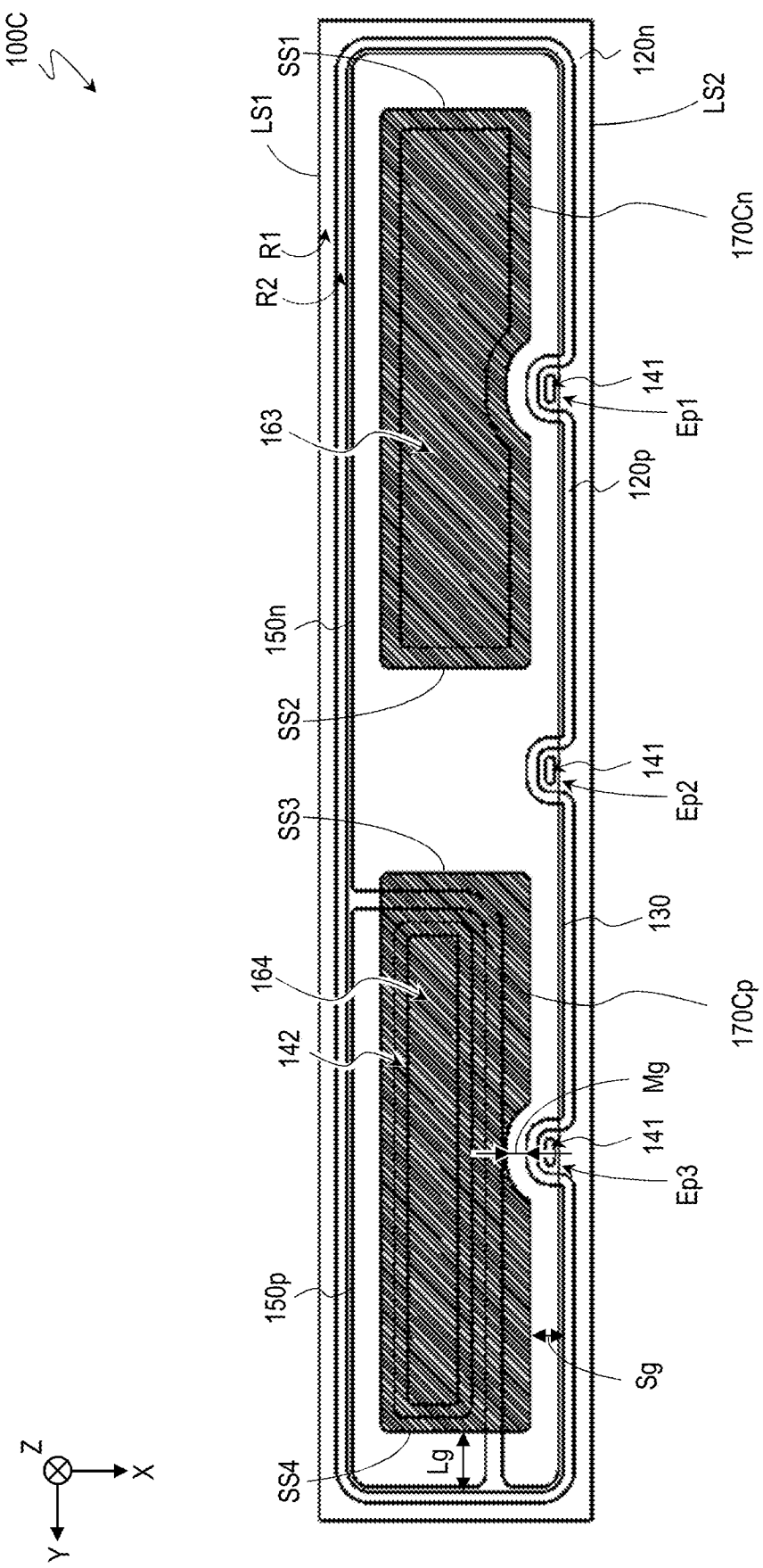

US 10,923,632 B2

LIGHT EMITTING ELEMENT AND LIGHT EMITTING DEVICE

CROSS-REFERENCE TO RELATED APPLICATIONS

The present application is a continuation of U.S. patent application Ser. No. 16/277,243, filed on Feb. 15, 2019, which claims priority to Japanese Patent Application No. 2018-026347, filed on Feb. 16, 2018, Japanese Patent Application No. 2018-195754, filed on Oct. 17, 2018, and Japanese Patent Application No. 2019-011449, filed on Jan. 25, 2019, the disclosures of which are hereby incorporated by reference in their entireties.

BACKGROUND

The present disclosure relates to a light emitting element and a light emitting device.

A light emitting device having a rectangular light emitting surface from which light is extracted is known. Such a light emitting device includes, for example, a light emitting element having a rectangular external shape as seen in a plan view, and typically has a parallelepiped overall external appearance. Such a light emitting device having a parallelepiped external appearance is combined with a light guide plate and used for a backlight unit of a liquid crystal display device, for example. Japanese Patent Publication No. 2016-143682 discloses a group-III nitride semiconductor light emitting element having a structure in which an n-type semiconductor layer and a p-type semiconductor layer are stacked on a rectangular sapphire substrate.

SUMMARY

Exemplary embodiments of the present disclosure provide a light emitting element having an improved reliability.

In one embodiment, a light emitting element includes a semiconductor structure including a first semiconductor layer of a first conductivity type including a first region and a second region located inward of the first region, an active layer located on the second region, and a second semiconductor layer of a second conductivity type located on the active layer, the first region including an outer peripheral region located along an outer perimeter of the second region as seen in a plan view and a plurality of extending portions each extending into the second region from the outer peripheral region; a light-reflective electrode covering a top surface of the second semiconductor layer; a first insulating layer covering the semiconductor structure and the light-reflective electrode and including first through-holes respectively located on the extending portions of the first region and a second through-hole located on the second region; a first internal electrode located on the first insulating layer and electrically connected with the first semiconductor layer via the first through-holes; a second internal electrode located on the first insulating layer and electrically connected with the light-reflective electrode via the second through-hole; a second insulating layer covering the first internal electrode and the second internal electrode and electrically insulating the first internal electrode and the second internal electrode from each other, the second insulating layer including a third through-hole located on the first internal electrode and a fourth through-hole located on the second internal electrode; a first external electrode electrically connected with the first internal electrode via the third through-hole and including a plurality of corner portions; and a second external electrode electrically connected with the second internal electrode via the fourth through-hole and including a plurality of corner portions. As seen in a plan view, the plurality of extending portions of the first region are each located in an area, on a top surface of the first semiconductor layer, other than an area overlapping any of the plurality of corner portions of the first external electrode and other than an area overlapping any of the plurality of corner portions of the second external electrode.

According to the above embodiment, a light emitting element having an improved reliability is provided.

BRIEF DESCRIPTION OF THE DRAWINGS

FIG. 17B is a schematic see-through view showing still another example of light emitting element (100C) in an embodiment according to the present disclosure.

DETAILED DESCRIPTION

Figure 1:
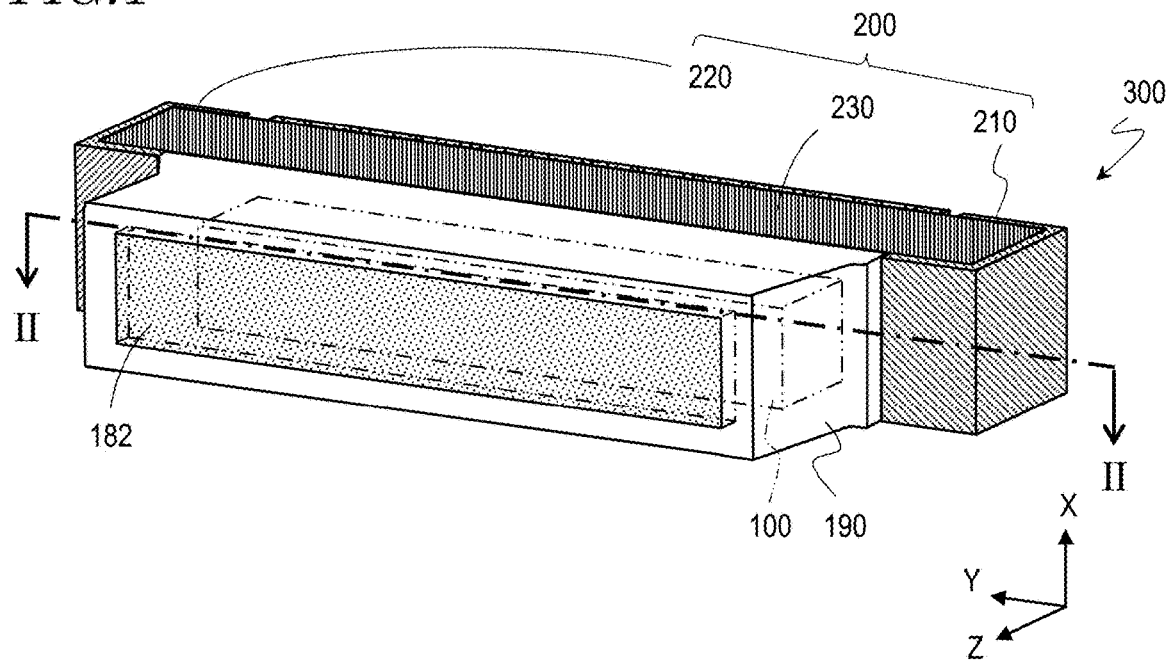
FIG. 1 is a perspective view showing an example of the external appearance of a light emitting device in an embodiment according to the present disclosure.

Hereinafter, embodiments according to the present disclosure will be described in detail with reference to the attached drawings. The following embodiments are illustrative, and the light emitting device according to the present disclosure is not limited to any of light emitting devices in the following embodiments. For example, the numerical values, shapes, materials, steps, the order of the steps, and the like shown in the following embodiments are merely examples, and may be modified in various manners as long as no technological contradiction occurs.

In the drawings, the sizes, the shapes or the like may be exaggerated for clear illustration, and may not reflect the sizes, the shapes and the size relationship among the components in an actual light emitting device. A part of the components may be omitted in order to avoid the drawings from being excessively complicated.

In the following description, components having substantially the same functions will be represented by the same reference signs, and the descriptions thereof may be omitted. In the following description, terms showing specific directions or positions (e.g., "top", "above", "bottom", "below", "right", "left" and terms including these terms") may be used. These terms are merely used to show relative directions or positions in a drawing referred to, for easier understanding. The components merely need to be arranged in the directional or positional relationship as described by use of the term "top", "above", "bottom", "below" or the like with reference to a drawing referred to. In any drawing other than those in the present disclosure, an actual product, an actual production device or the like, the components do not need to be positionally arranged as exactly shown in a drawing referred to. In the present disclosure, the term "parallel" encompasses a case in which two straight lines, sides, planes or the like make an angle in the range of approximately 0°±5° unless otherwise specified. In the present disclosure, the terms "vertical" and "perpendicular" encompass a case in which two straight lines, sides, planes or the like make an angle in the range of approximately 90°±5° unless otherwise specified.

(Embodiment of Light Emitting Element and Light Emitting Device)

Figure 2:
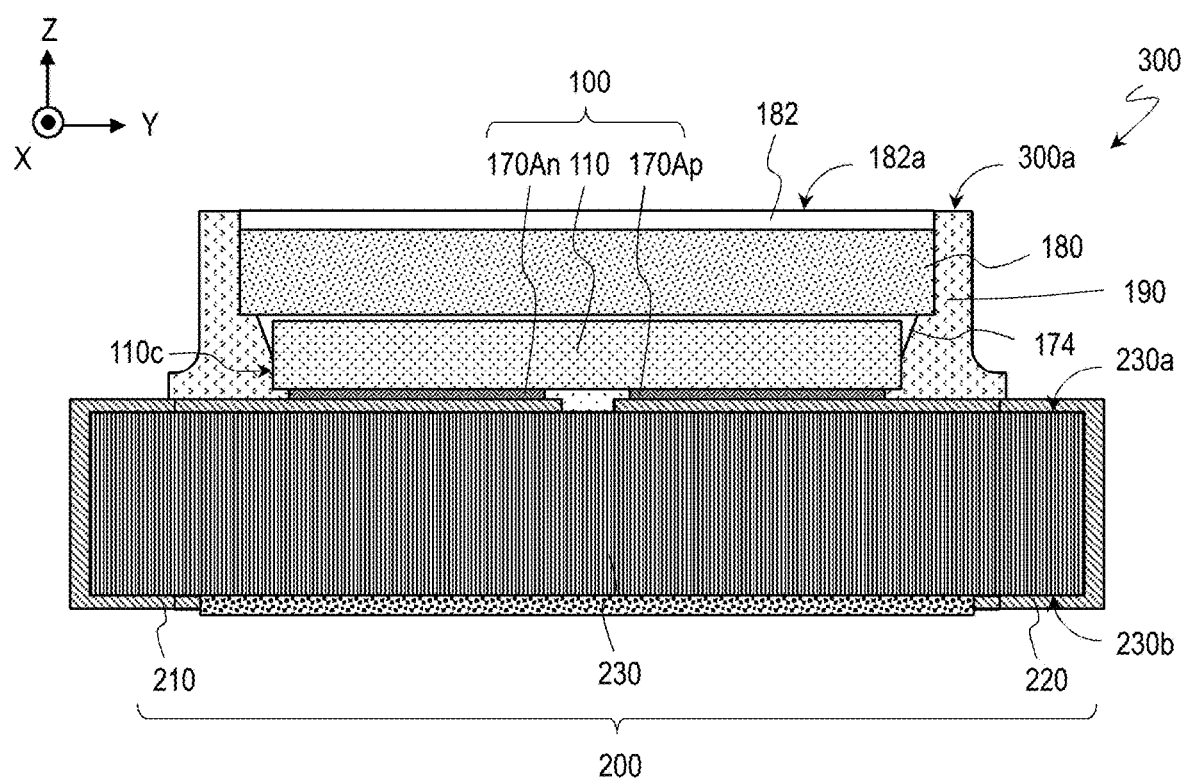
FIG. 2 is a schematic cross-sectional view taken along line II-II in FIG. 1.

FIG. 1 shows an example of the external appearance of a light emitting device in an embodiment according to the present disclosure. FIG. 2 is a schematic cross-sectional view taken along line II-II in FIG. 1. For reference, FIG. 1 and FIG. 2 show an X axis, a Y axis and a Z axis perpendicular to each other. The other drawings of the present disclosure also show the X axis, the Y axis and the Z axis.

The light emitting device 300 shown in FIG. 1 and FIG. 2 generally includes a light emitting element 100 including a light-transmissive first substrate and a semiconductor structure on the first substrate, and a support 200 as a second substrate supporting the light emitting element 100. In the structure shown in FIG. 1, the light emitting element 100 is covered with a light-reflective member 190. Light from the light emitting element 100 is output generally in the Z direction in FIG. 1 via a light-transmissive member 182 located on a front surface (in FIG. 1) of the light emitting element 100.

As shown in FIG. 1 and FIG. 2, the support 200 includes an insulating base 230, and a first wiring portion 210 and a second wiring portion 220 on the base 230. As shown in FIG. 2, the light emitting element 100 generally includes a light emitting structure 110 including, in a part thereof, the first substrate and the semiconductor structure described above. The light emitting element 100 further includes a first external electrode 170An and a second external electrode 170Ap supplying an electric current to the light emitting structure 110. As schematically shown in FIG. 2, the first wiring portion 210 and the second wiring portion 220 of the support 200 are provided to cover the base 230 from a top surface 230a to a bottom surface 230b of the base 230. The first wiring portion 210 is connected with the first external electrode 170An of the light emitting element 100, and the second wiring portion 220 is connected with the second external electrode 170Ap of the light emitting element 100. The first wiring portion 210 and the second wiring portion 220 are electrically and physically connected with the light emitting structure 110 of the light emitting element 100 respectively via the first external electrode 170An and the second external electrode 170Ap. The light emitting structure 110 will be described in detail below.

In the structure shown in FIG. 2, the light emitting device 300 includes a wavelength conversion member 180 and the light-transmissive member 182 above the light emitting element 100. The wavelength conversion member 180 is, for example, a plate-like member formed of a silicone resin and particles of YAG-based phosphor or the like dispersed in the silicone resin. The light-transmissive member 182 is, for example, a plate-like member mainly formed of a silicone resin. A light guide member 174 is located between the wavelength conversion member 180 and the light emitting element 100. The light guide member 174 is, for example, a light-transmissive member formed of a silicone resin. As shown in FIG. 2, a part of the light guide member 174 covers lateral surfaces 110c of the light emitting structure 110. The light-reflective member 190 described above encloses the components on the support 200. As schematically shown in FIG. 2, a top surface 182a of the light-transmissive member 182 is exposed from the light-reflective member 190. The top surface 182a of the light-transmissive member 182 is a part of a top surface 300a of the light emitting device 300. The light-reflective member 190 includes, for example, a matrix formed of a resin material containing a silicone resin and a light-scattering filler dispersed in the resin material.

Figure 3:
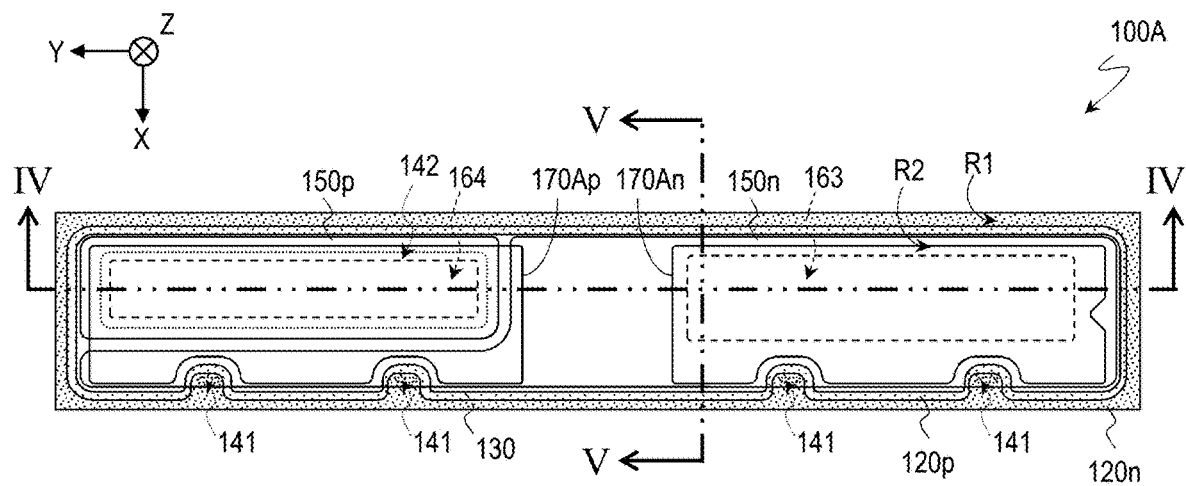
FIG. 3 is a schematic bottom see-through view of an example of light emitting element in an embodiment according to the present disclosure.
Figure 4:
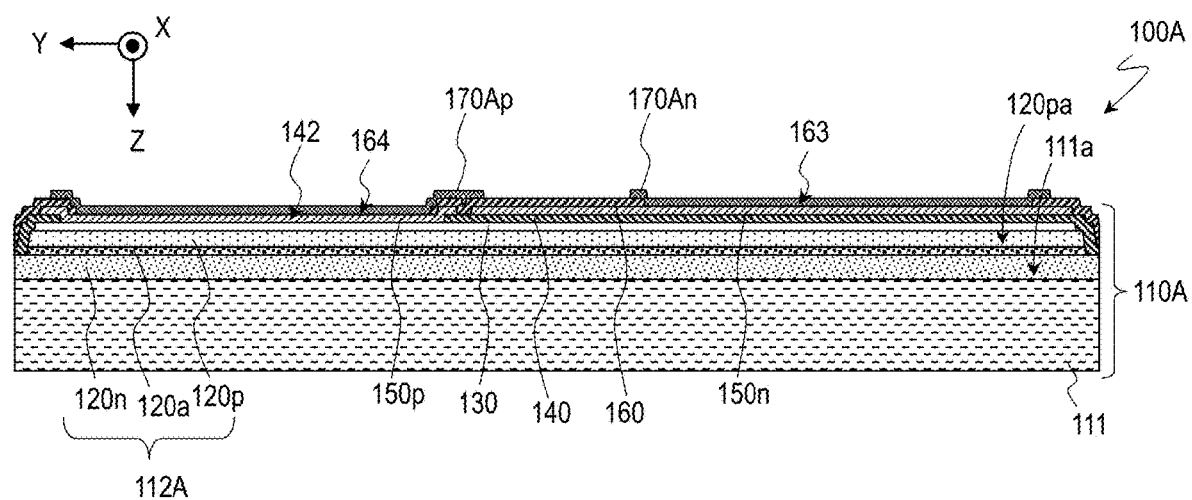
FIG. 4 is a schematic cross-sectional view taken along line IV-IV in FIG. 3.
Figure 5:
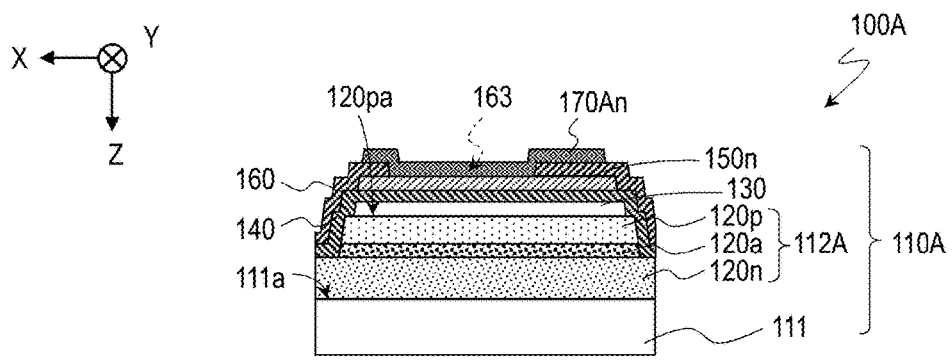
FIG. 5 is a schematic cross-sectional view taken along line V-V in FIG. 3.

Hereinafter, the light emitting element 100 will be described in detail with reference to the drawings. FIG. 3 is a schematic bottom see-through view of a light emitting element in an embodiment according to the present disclosure. FIG. 4 is a schematic cross-sectional view taken along line IV-IV in FIG. 3. FIG. 5 is a schematic cross-sectional view taken along line V-V in FIG. 3.

The light emitting element 100A shown in FIG. 3 through FIG. 5 is an example of the light emitting element 100 described above with reference to FIG. 1 and FIG. 2. In the structure shown in FIG. 3 through FIG. 5, the light emitting element 100A is rectangular and is longer in the Y direction than in the X direction as in from a plan view. The light emitting element 100A has a length in the X direction of, for example, about 100 µm to about 300 µm. The light emitting element 100A has a length in the Y direction of, for example, about 700 µm to about 1400 µm, preferably about 900 µm to about 1200 µm.

As shown in FIG. 4 and FIG. 5, a light emitting structure 110A of the light emitting element 100A includes a light-transmissive first substrate 111 and a semiconductor structure 112A supported by the first substrate 111. The first substrate 111 is typically a sapphire substrate. The semiconductor structure 112A typically contains a nitride semiconductor ($In_xAl_yGa_{1-x-y}N$, $0 \leq x$, $0 \leq y$, $x+y \leq 1$) capable of emitting light of a wavelength in an ultraviolet light region to a visible light region.

The semiconductor structure 112A includes an n-type semiconductor layer 120n as a first semiconductor layer having a first conductivity type, a p-type semiconductor layer 120p as a second semiconductor layer having a second conductivity type, and an active layer 120a located between the n-type semiconductor layer 120n and the p-type semiconductor layer 120p. The light emitting structure 110A of the light emitting element 100A includes a plurality of insulating layers and a plurality of electrodes in addition to the semiconductor structure 112A. As shown in FIG. 4 and FIG. 5, the light emitting structure 110A includes a first insulating layer 140, a second insulating layer 160, a light-reflective electrode 130 located between the p-type semiconductor layer 120p and the first insulating layer 140, a first internal electrode 150n, and a second internal electrode 150p.

Among the components of the semiconductor structure 112A, the n-type semiconductor layer 120n is located on the first substrate 111 and covers generally the entirety of a top surface 111a of the first substrate 111. As shown in FIG. 3, the n-type semiconductor layer 120n includes a first region R1 and a second region R2 located inward of the first region R1. In other words, a top surface of the n-type semiconductor layer 120n includes the first region R1 and the second region R2 located inward of the first region R1. The active layer 120a is selectively formed on the second region R2 of the n-type semiconductor layer 120n. The p-type semiconductor layer 120p on the active layer 120a is also located generally just above the second region R2. In other words, a part of the n-type semiconductor layer 120n that is in the first region R1 is not covered with the active layer 120a or the p-type semiconductor layer 120p, and is exposed from these layers.

Figure 6:
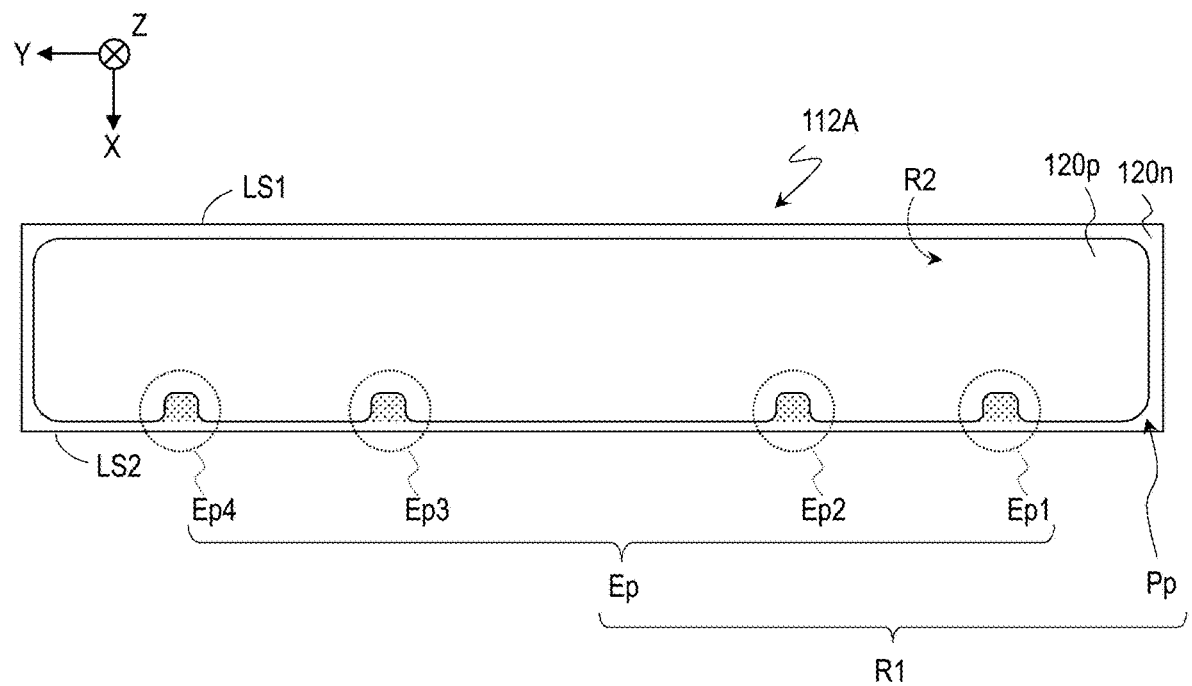
FIG. 6 is a schematic plan view provided to describe the positional relationship between a p-type semiconductor layer 120p and an n-type semiconductor layer 120n.

FIG. 6 shows the positional relationship between the p-type semiconductor layer 120p and the n-type semiconductor layer 120n. FIG. 6 corresponds to a figure showing the n-type semiconductor layer 120n, the active layer 120a and the p-type semiconductor layer 120p, among the components of the light emitting structure 110A. As described above, the active layer 120a and the p-type semiconductor layer 120p covers the second region R2 of the n-type semiconductor layer 120n. The active layer 120a is not explicitly shown in FIG. 6 but may be considered to occupy substantially the same area as the area occupied by the p-type semiconductor layer 120p.

As shown in FIG. 6, the first region R1 of the n-type semiconductor layer 120n includes an outer peripheral region Pp located along an outer perimeter of the second region R2 as seen in a plan view and a plurality of extending portions Ep. FIG. 6 shows areas that correspond to the extending portions Ep of the first region R1 as shaded areas for easier understanding. As shown in FIG. 6, the plurality of extending portions Ep are parts of the first region R1 that extend into the second region R2 from the outer peripheral region Pp. From another perspective, it may be considered that the second region R2 includes a plurality of recessed portions (notches) as seen in a plan view, and the extending portions Ep of the first region R1 are formed in the recessed portions. The active layer 120a and the p-type semiconductor layer 120p may each be considered to include a plurality of recessed portions (notches) at positions corresponding to the extending portions Ep of the first region R1 as seen in a plan view.

In this example, the n-type semiconductor layer 120n has a rectangular external shape including a first longer side LS1 and a second longer side LS2 facing each other as seen in a plan view. Four extending portions Ep are provided closer to the second longer side LS2 than to the first longer side LS1. In this example, the first longer side LS1 and the second longer side LS2 are parallel to the Y direction.

The semiconductor structure 112A may be formed by a known semiconductor process. For example, the n-type semiconductor layer 120n, the active layer 120a and the p-type semiconductor layer 120p may be formed as follows. Nitride semiconductor layers are formed on the top surface 111a of the first substrate 111 by metal organic chemical vapor deposition (referred to also as MOCVD), metal organic vapor phase epitaxy (referred to also as MOVPE), hydride vapor phase epitaxy (HVPE) or the like. Then, a part of each of the layers to be the active layer 120a and the p-type semiconductor layer 120p that is on the first region R1 is removed by photolithography and etching.

Referring to FIG. 4 and FIG. 5, the light-reflective electrode 130 covers a top surface 120pa of the p-type semiconductor layer 120p and is electrically connected with the p-type semiconductor layer 120p. The light-reflective electrode 130 has a function of providing an electric current to a greater area of the p-type semiconductor layer 120p. The light-reflective electrode 130 is provided to cover substantially the entirety of the top surface 120pa of the p-type semiconductor layer 120p. With such a structure, light traveling toward a top surface of the light emitting element 100A in FIG. 4 and FIG. 5, in other words, light traveling in a direction opposite to a direction toward the first substrate 111, is reflected by the light-reflective electrode 130, so that the light travels toward the first substrate 111 of the light emitting element 100A. Thus, an effect of improving the light extraction efficiency is provided. The light-reflective electrode 130 may be formed of a film of, for example, Ag, Al or an alloy containing at least one of Ag and Al. The light-reflective electrode 130 may be formed as follows. A metal film or an alloy film is formed by, for example, sputtering, and an unnecessary part of the film is removed by etching.

The first insulating layer 140 is provided on the light-reflective electrode 130. The first insulating layer 140 is formed of, for example, an oxide or a nitride containing at least one selected from the group consisting of Si, Ti, Zr, Nb, Ta, Al and Hf. The first insulating layer 140 is typically an insulating layer formed of $SiO_2$. The first insulating layer 140 covers the semiconductor structure 112A and the light-reflective electrode 130. An SiN layer may be provided between the light-reflective electrode 130 and the first insulating layer 140 and serve as a barrier layer suppressing migration of the material of the light-reflective electrode 130.

Figure 7:
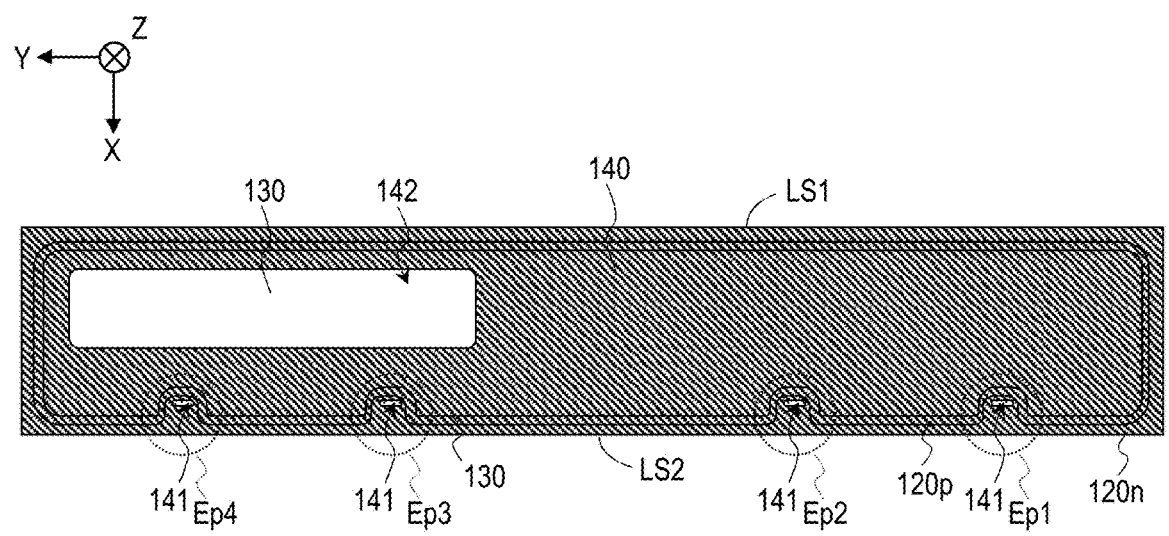
FIG. 7 is a schematic plan view showing a state in which a first insulating layer 140 is formed on a light-reflective electrode 130.

FIG. 7 schematically shows a state in which the first insulating layer 140 is formed on the light-reflective electrode 130. In FIG. 7, the area where the material of the first insulating layer 140 is provided is hatched. As schematically shown in FIG. 7, the first insulating layer 140 includes first through-holes 141 located at positions corresponding to the extending portions Ep1 through Ep4 of the first region R1 of the n-type semiconductor layer 120*n*, and also includes a second through-hole 142 located above the second region R2 of the n-type semiconductor layer 120*n*. In this example, four first through-holes 141 are provided along the second longer side LS2 of the rectangular external shape of the n-type semiconductor layer 120*n*. The extending portions Ep are located along one of the longer sides of the rectangular external shape (in this example, the second longer side LS2), so that the luminance non-uniformity is made less conspicuous.

At the four first through-holes 141, the extending portions Ep1 through Ep4 are exposed from the first insulating layer 140. At the second through-hole 142, a surface of the light-reflective electrode 130 is exposed from the first insulating layer 140. The first through-holes 141 may, for example, have a diameter longer in the Y direction than a diameter in the X direction. With such a shape, even in the case in which the n-type semiconductor layer 120*n* has a lengthy rectangular external shape as in this embodiment, each portion of the top surface of the n-type semiconductor layer 120*n* that is to be connected with the first internal electrode 150*n* described below may have a relatively large area size, and the area size of the active layer 120*a* is suppressed from being decreased due to the provision of the first through-holes 141. Needless to say, the shape and the number of the second through-hole 142 in FIG. 7 are mere examples. The shape of each of the first through-holes 141 is not limited to the shape shown in FIG. 7.

As shown in FIG. 4, the first internal electrode 150*n* and the second internal electrode 150*p* are provided on the first insulating layer 140. The first internal electrode 150*n* and the second internal electrode 150*p* may be formed of, for example, Ag, Al or an alloy containing at least one of Ag and Al. Especially, Al and an Al alloy provide a high reflectance and are less easily migrated than Ag, and thus are advantageous as a material of the first internal electrode 150*n* and the second internal electrode 150*p*.

Figure 8:
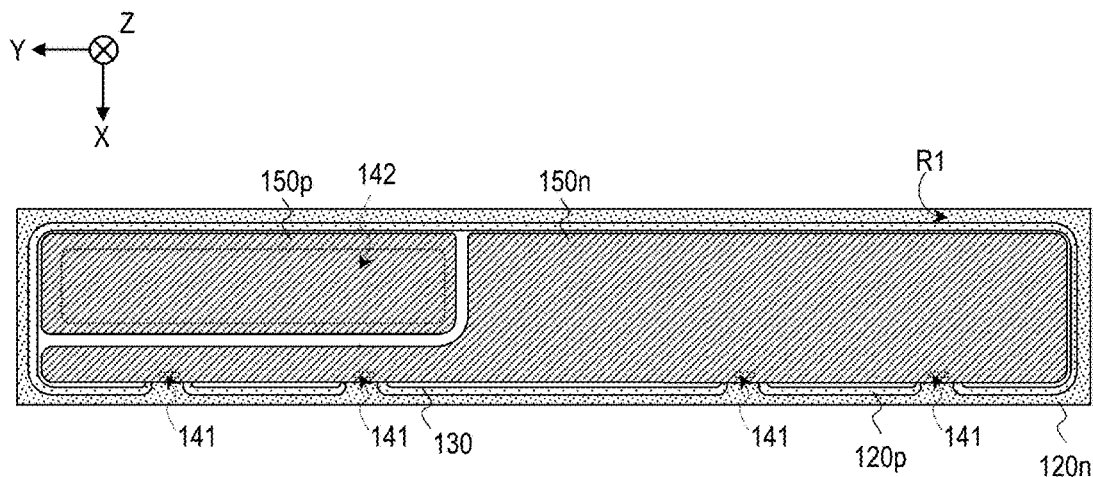
FIG. 8 is a schematic plan view showing a state in which a first internal electrode 150n and a second internal electrode 150p are formed on the first insulating layer 140.

FIG. 8 schematically shows a state in which the first internal electrode 150*n* and the second internal electrode 150*p* are formed on the first insulating layer 140. The first internal electrode 150*n* is electrically connected with the n-type semiconductor layer 120*n* at the positions of the extending portions Ep1 through Ep4 via the first through-holes 141. The second internal electrode 150*p* is electrically connected with the light-reflective electrode 130 via the second through-hole 142. Namely, the second internal electrode 150*p* is electrically connected with the p-type semiconductor layer 120*p*.

Referring to FIG. 4, the second insulating layer 160 is formed on the first internal electrode 150*n* and the second internal electrode 150*p* and covers the first internal electrode 150*n* and the second internal electrode 150*p*. Like the first insulating layer 140, the second insulating layer 160 may be formed of, for example, an inorganic material such as $SiO_2$ or the like, and electrically insulates the first internal electrode 150*n* and the second internal electrode 150*p* from each other.

Figure 9:
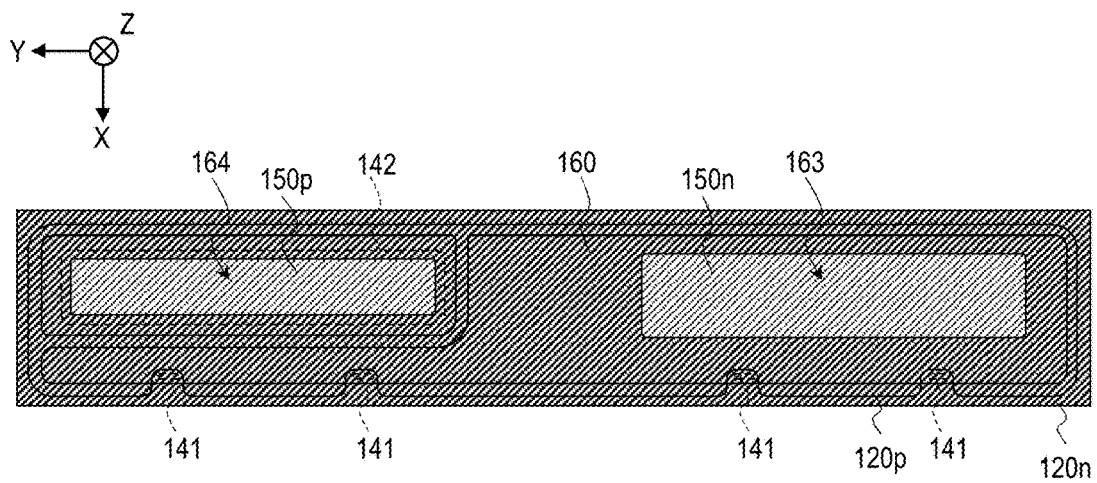
FIG. 9 is a schematic plan view showing a state in which a second insulating layer 160 is formed on the first internal electrode 150n and the second internal electrode 150p.

FIG. 9 shows a state in which the second insulating layer 160 is formed on the first internal electrode 150*n* and the second internal electrode 150*p*. The second insulating layer 160 includes a through-hole 163 at a position overlapping the first internal electrode 150*n* as seen in a plan view, and also includes a fourth through-hole 164 at a position overlapping the second internal electrode 150*p* as seen in a plan view. As schematically shown in FIG. 9, a surface of the first internal electrode 150*n* is exposed from the second insulating layer 160 at the third through-hole 163, and a surface of the second internal electrode 150*p* is exposed from the second insulating layer 160 at the fourth through-hole 164. Needless to say, the shape and the number of each of the third through-hole 163 and the fourth through-hole 164 are not limited to those shown in FIG. 9.

As shown in, for example, FIG. 4, the first external electrode 170An and the second external electrode 170Ap described above are located on the second insulating layer 160. As can be seen from FIG. 3 and FIG. 4, the first external electrode 170An is electrically connected with the first internal electrode 150*n* via the third through-hole 163 of the second insulating layer 160. Since the first internal electrode 150*n* is connected with the n-type semiconductor layer 120*n* at the extending portions Ep1 through Ep4 of the n-type semiconductor layer 120*n*, the first external electrode 170An is electrically connected with the n-type semiconductor layer 120*n* via the first internal electrode 150*n*. The second external electrode 170Ap is electrically connected with the second internal electrode 150*p* via the fourth through-hole 164 of the second insulating layer 160, and thus is electrically connected with the p-type semiconductor layer 120*p* via the second internal electrode 150*p* and the light-reflective electrode 130.

Figure 10:
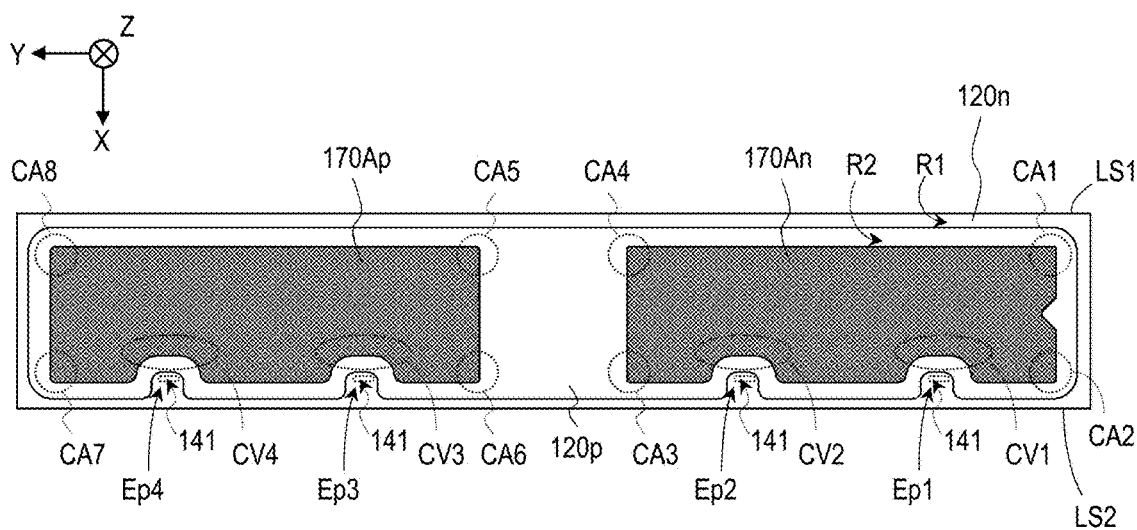
FIG. 10 is a plan view schematically showing a semiconductor structure 112A, a first external electrode 170An and a second external electrode 170Ap among components of a light emitting element 100A.

FIG. 10 shows the semiconductor structure 112A, the first external electrode 170An and the second external electrode 170Ap, among the components of the light emitting element 100A. FIG. 10 also shows the first through-holes 141 of the first insulating layer 140 with dashed lines.

The first external electrode 170An and the second external electrode 170Ap each typically have an external shape having a plurality of corner portions as seen in a plan view. As shown in FIG. 10, in this example, the external shape of each of the first external electrode 170An and the second external electrode 170Ap is rectangular with four corner portions as seen in a plan view. In the structure shown in FIG. 10, the external shape of the first external electrode 170An is generally rectangular and includes four corner portions CA1 through CA4 as seen in a plan view. Similarly, in this example, the external shape of the second external electrode 170Ap is generally rectangular and includes four corner portions CA5 through CA8 as seen in a plan view.

The first external electrode 170An and the second external electrode 170Ap are formed of, for example, Ti, Pt, Rh, Au, Ni, Ta, Zr or the like. The first external electrode 170An and the second external electrode 170Ap may each have a single-layer structure or a stack structure including a plurality of layers. For example, the first external electrode 170An and the second external electrode 170Ap may each be a metal layer having a stack structure including a Ti layer, a Pt layer and an Au layer stacked in this order.

As schematically shown in FIG. 10, in an embodiment according to the present disclosure, none of the plurality of extending portions Ep of the first region R1 of the n-type semiconductor layer 120*n* is located at a position in the top surface of the n-type semiconductor layer 120*n* that overlaps any of the plurality of corner portions of the first external electrode 170An as seen in a plan view. None of the plurality of extending portions Ep of the first region R1 of the n-type semiconductor layer 120*n* is located at a position in the top surface of the n-type semiconductor layer 120*n* that overlaps any of the plurality of corner portions of the second external electrode 170Ap as seen in a plan view. In the example shown in FIG. 10, the four extending portions Ep1 through Ep4 located in series along the second longer side LS2 of the rectangular external shape of the n-type semiconductor layer 120n are located in areas other than an area overlapping any of the corner portions CA1 through CA4 of the first external electrode 170An and other than an area overlapping any of the corner portions CA5 through CA8 of the second external electrode 170Ap.

In this example, the first external electrode 170An and the second external electrode 170Ap each have recessed portions (notches) corresponding to the extending portions Ep of the first region R1 as seen in a plan view. In the example shown in FIG. 10, the external shape of the first external electrode 170An as seen in a plan view includes a recessed portion CV1 as a first recessed portion at a position corresponding to the extending portion Ep1 and also includes a recessed portion CV2 as a second recessed portion at a position corresponding to the extending portion Ep2. Similarly, the external shape of the second external electrode 170Ap as seen in a plan view includes a recessed portion CV3 as a third recessed portion at a position corresponding to the extending portion Ep3 and also includes a recessed portion CV4 as a fourth recessed portion at a position corresponding to the extending portion Ep4. Namely, in this example, the first external electrode 170An and the second external electrode 170Ap each have a shape that does not overlap any of the plurality of extending portions Ep located in the first region R1 of the n-type semiconductor layer 120n as seen in a plan view. The first external electrode 170An and the second external electrode 170Ap each have an external shape having recessed portions at the positions corresponding to the extending portions Ep as seen in a plan view. Since such a shape is adopted for the first external electrode 170An and the second external electrode 170Ap, an undesirable possibility may be decreased that a heat stress is concentrated in, or in the vicinity of, an area where the p-type semiconductor layer 120p of the semiconductor structure 112A is selectively removed and the n-type semiconductor layer 120n is exposed and as a result, the insulating layers or the electrodes are peeled off.

The first external electrode 170An and the second external electrode 170Ap of the light emitting element 100A are electrically and physically connected respectively with the first wiring portion 210 and the second wiring portion 220 by eutectic bonding. With such a structure, the light emitting element 100A may be mounted on the support 200. The base 230 of the support 200 is formed of, for example, bismaleimide-triazine resin (BT resin), and the first wiring portion 210 and the second wiring portion 220 of the support 200 are typically Cu lines.

Figure 11:
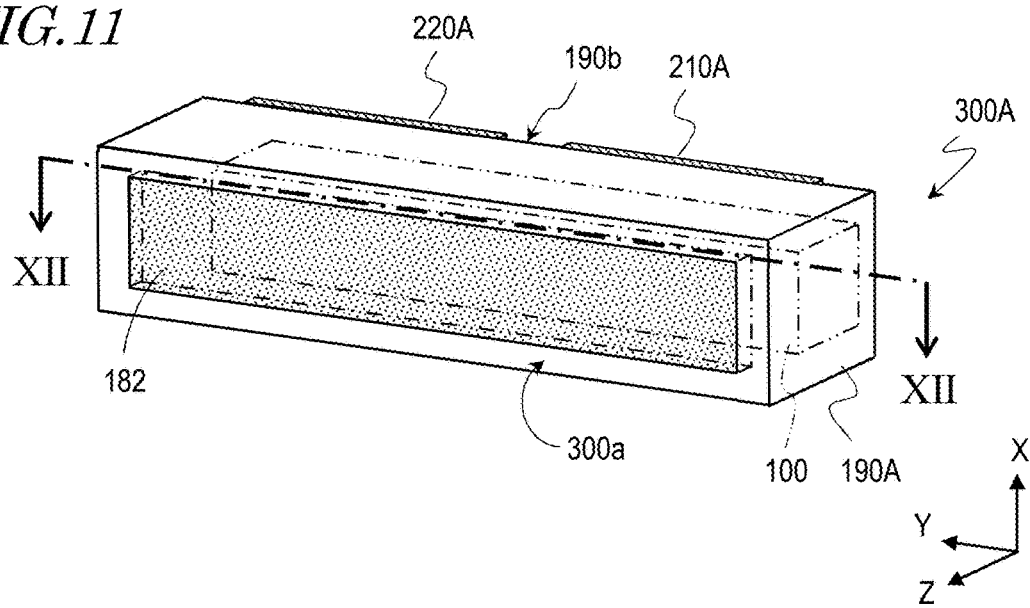
FIG. 11 is a perspective view showing another example of the external appearance of a light emitting device in an embodiment according to the present disclosure.

FIG. 11 shows a light emitting device having another example of the external shape in an embodiment according to the present disclosure. The light emitting device 300A shown in FIG. 11 generally includes the light emitting element 100, the light-transmissive member 182, and a light-reflective member 190A. As shown in FIG. 11, the light-reflective member 190A is parallelepiped and is longer in the Y direction than in the X direction, like the light-reflective member 190 in the light emitting device 300 shown in FIG. 1.

Unlike the light emitting device 300 described above with reference to FIG. 1, the light emitting device 300A shown in FIG. 11 does not include the support 200 supporting the light emitting element 100. It should be noted that the light emitting device 300A includes a set of lines, more specifically, a first wiring portion 210A and a second wiring portion 220A located on a bottom surface 190b of the light-reflective member 190. The bottom surface 190b is located on the side opposite to the top surface 300a of the light emitting device 300.

Figure 12:
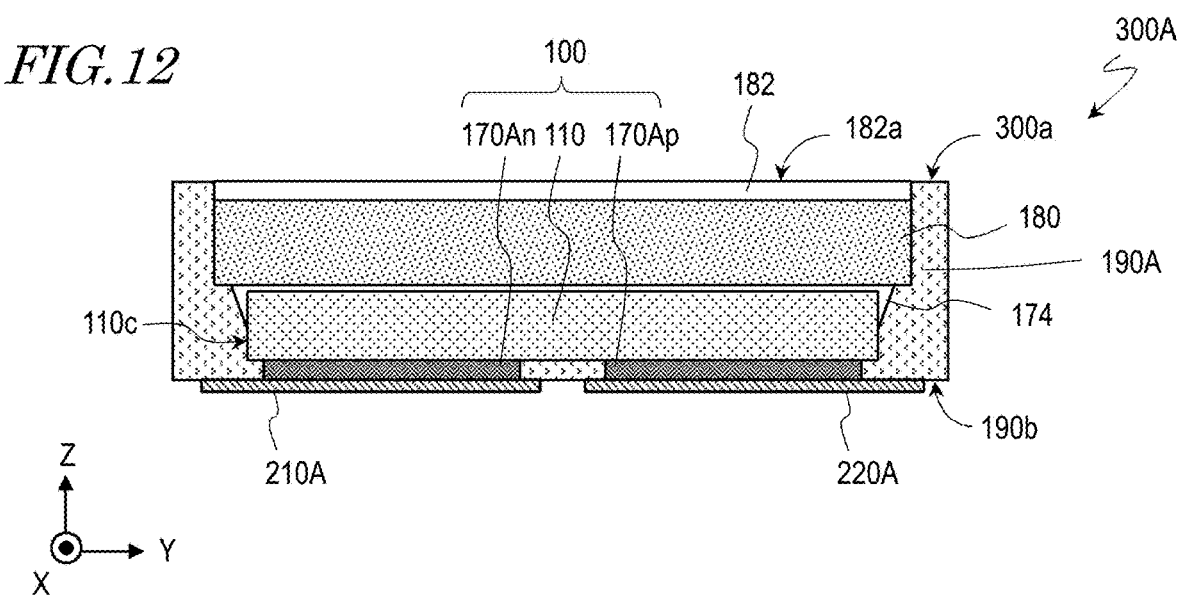
FIG. 12 is a schematic cross-sectional view taken along line XII-XII in FIG. 11.

FIG. 12 is schematic cross-sectional view taken along line XII-XII in FIG. 11. In other words, FIG. 12 corresponds to FIG. 2 referred to above. As shown in FIG. 12, the first wiring portion 210A is connected with the first external electrode 170An of the light emitting element 100, and the second wiring portion 220A is connected with the second external electrode 170Ap of the light emitting element 100. As in this example, the first wiring portion 210A connected with the first external electrode 170An of the light emitting element 100 and the second wiring portion 220A connected with the second external electrode 170Ap of the light emitting element 100 may be located on the bottom surface 190b located opposite to the top surface 300a of the light emitting device 300A. In an embodiment according to the present disclosure, the base 230 supporting the first wiring portion and the second wiring portion is not absolutely necessary.

(Suppression of Occurrence of a Leak)

As described below by way of examples (i.e., Reference examples 1 through 4), the studies made by the present inventors have found the following. An external electrode provided to electrically and physically connect a light emitting element with a support such as a printed wiring board or the like may have an external shape including a corner portion as seen in a plan view. In such a case, when the external electrode is connected with a conducting line on the printed wiring board or the like (e.g., circuit trace) by eutectic bonding, a heat stress is likely to be concentrated on the corner portion of the external electrode. If a component that electrically connects an n-type semiconductor layer with an electrode located above the n-type semiconductor layer and inside a light emitting structure, for example, a through-hole provided in an insulating layer, overlaps the corner portion of the external electrode as seen in a plan view, a crack may be caused in the insulating layer due to the heat stress. When this occurs, a leak may occur between the external electrode and the electrode located inside the light emitting structure. Especially in the case in which a bonding member used for the eutectic bonding is formed of AuSn, a stronger bonding is realized than in the case in which AgSn, CuSn or the like is used. However, AuSn has a higher melting point than AgSn, CuSn or the like, and therefore, the heat stress caused in the external electrode is likely to be increased. In the case in which a conducting line on the printed wiring board connected with the light emitting element is formed of Cu, which has a relatively high thermal conductivity and a relatively large coefficient of thermal expansion among various metal materials, heat dissipation is easily provided with certainty but a larger heat stress is likely to be caused in the external electrode due to the difference in the coefficient of thermal expansion between the Cu conducting line and the light emitting element.

The present inventors have found that provision of a through-hole at a position not overlapping the corner portion of the external electrode suppresses the leak from being caused due to the heat stress, and may improve the reliability of the light emitting element. Hereinafter, this will be described with reference to the drawings.

Figure 13:
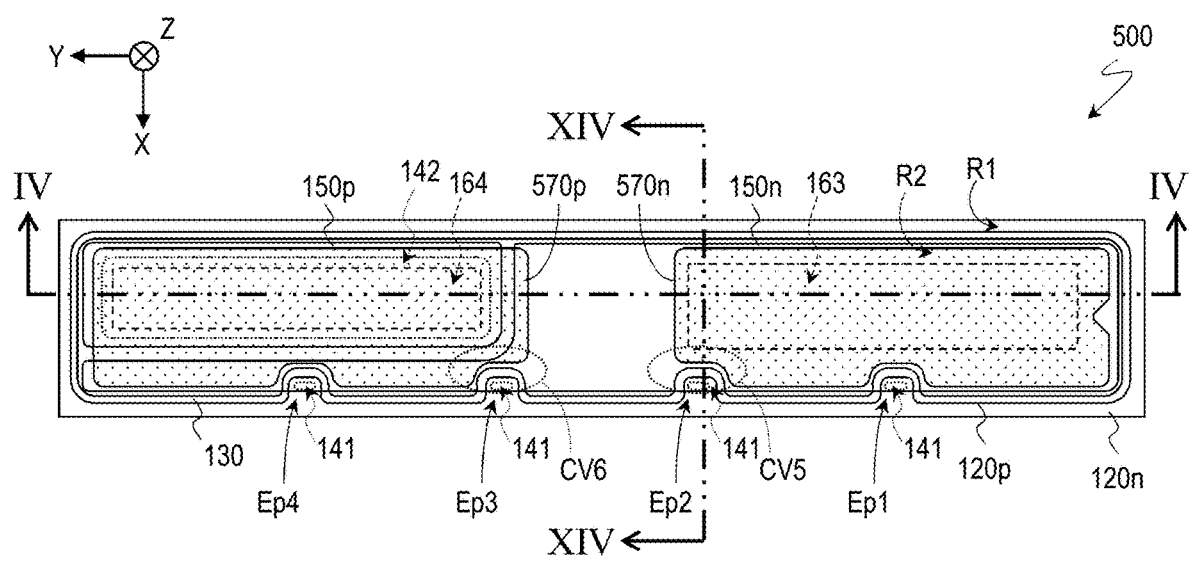
FIG. 13 is a schematic see-through view of a light emitting element in a comparative example including a plurality of extending portions and a plurality of through-holes provided in an insulating layer, the extending portions and the through-holes being located at positions overlapping corner portions of an external electrode.

FIG. 13 shows a light emitting element in a comparative example. The light emitting element 500 shown in FIG. 13 includes a plurality of extending portions and a plurality of through-holes provided in an insulating layer. The extending portions and the through-holes are located at positions overlapping the corner portions of an external electrode. A main difference between the light emitting element 500 and the light emitting element 100A shown in FIG. 3 and the like is that the light emitting element 500 includes a first external electrode 570*n* and a second external electrode 570*p* instead of the first external electrode 170*n* and the second external electrode 170*p*.

FIG. 13 is a schematic bottom see-through view of the light emitting element 500, like FIG. 3. The first external electrode 570*n* and the second external electrode 570*p* are depicted as shaded regions for easier understanding. As shown in FIG. 13, in this comparative example, the first external electrode 570*n* has a generally rectangular external shape, and includes a recessed portion CV5 in a left bottom corner portion in the paper sheet of FIG. 13 among four corner portions of the rectangular external shape. The recessed portion CV5 overlaps the extending portion Ep2 as seen in a plan view. Similarly, the second external electrode 570*p* also has a generally rectangular external shape, and includes a recessed portion CV6 in a right bottom corner portion in the paper sheet of FIG. 13 among the four corner portions of the rectangular external shape. The recessed portion CV6 overlaps the extending portion Ep3 as seen in a plan view.

Figure 14:
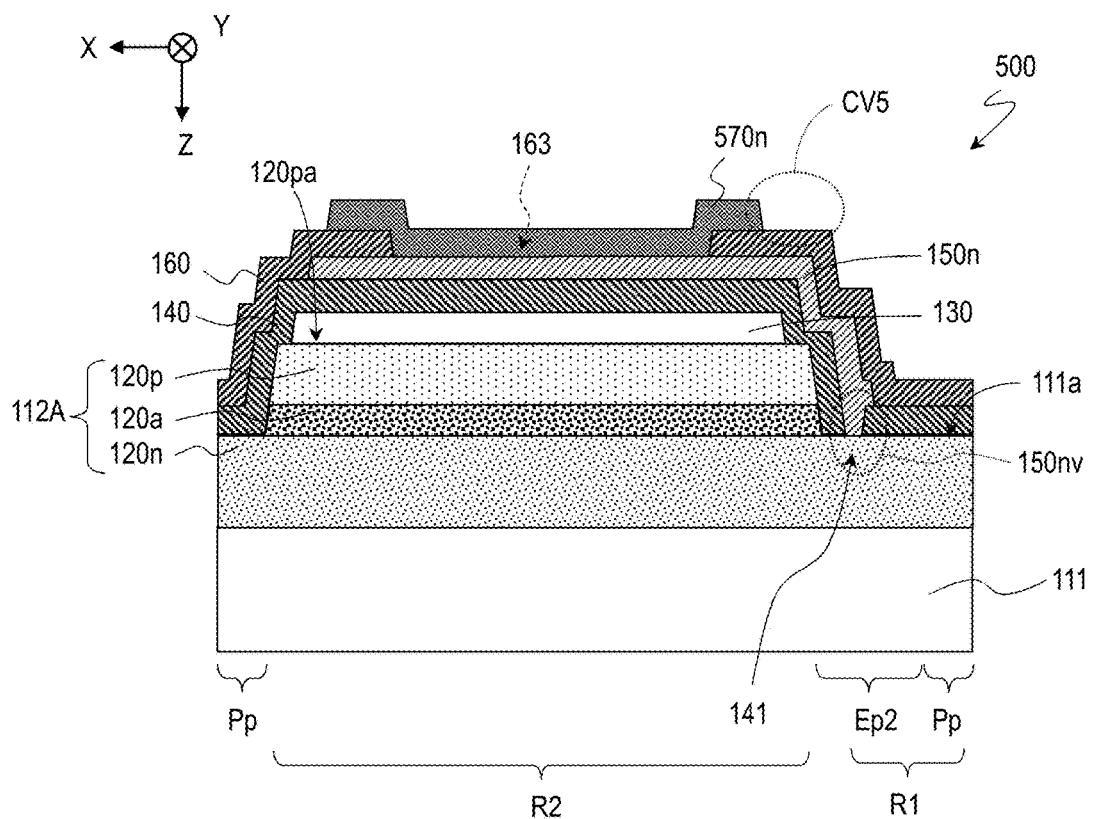
FIG. 14 is a schematic cross-sectional view taken along line XIV-XIV in FIG. 13.

FIG. 14 is a schematic cross-sectional view taken along line XIV-XIV in FIG. 13. A cross-sectional view taken along line IV-IV in FIG. 13 may be substantially the same as the cross-sectional view in FIG. 4. Thus, the cross-sectional view taken along line IV-IV in FIG. 13 will not be shown, and the structure in this cross-sectional view will not be described.

In this comparative example, the extending portion Ep2 is located substantially just below the recessed portion CV5 of the first external electrode 570*n*, and one of the first through-holes 141 of the first insulating layer 140 is also located substantially just below the recessed portion CV5. As schematically shown in FIG. 14, a part of the first internal electrode 150*n* is a via 150*nv*, which fills the first through-hole 141 to electrically connect the first internal electrode 150*n* with the n-type semiconductor layer 120*n*.

As schematically shown in FIG. 14, the first internal electrode 150*n* covers a lateral surface of the first insulating layer 140 in the vicinity of the first through-hole 141 and is connected with the n-type semiconductor layer 120*n*. According to the studies made by the present inventors, when a heat stress caused by eutectic bonding is concentrated in, and in the vicinity of, an area of the n-type semiconductor layer 120*n* that is not covered with the active layer 120*a* or the p-type semiconductor layer 120*p*, a crack may be caused in the first insulating layer 140, specifically, for example, at a stepped portion of the first insulating layer 140. If, for example, the crack is caused in the first insulating layer 140, short-circuiting may occur between a p-side electrode and an n-side electrode (e.g., the light-reflective electrode or the n-side internal electrode) due to the migration of the material of the electrode located inside the light emitting structure. Namely, a leak may occur, and the reliability of the light emitting element 500 may be decreased.

By contrast, in this embodiment, the extending portions Ep, on which the first through-holes 141 of the first insulating layer 140 are provided, are located at positions not overlapping any of the corner portions CA1 through CA4 of the first external electrode 170An or any of the corner portions CA5 through CA8 of the second external electrode 170Ap. The heat stress is highly possibly concentrated on the corner portions CA1 through CA4 and the corner portions CA5 through CA8. Such a structure provides an effect of suppressing a leak from being caused due to the short-circuiting between, for example, the light-reflective electrode 130 and the first internal electrode 150*n*. A presumable reason for this is that the concentration of the heat stress in, or in the vicinity of, a conductive component that provides electrical connection to the n-type semiconductor layer 120*n* such as, for example, the via 150*vn*, is avoided and therefore, generation of a crack in the first insulating layer 140 may be avoided.

As described above, in an embodiment according to the present disclosure, the occurrence of a leak in the light emitting element is suppressed and thus the reliability of the light emitting element can be improved. The first external electrode 170An and the second external electrode 170Ap are located in areas other than an area overlapping any of the plurality of extending portions Ep as seen in a plan view; or as shown in FIG. 10, the first external electrode 170An and the second external electrode 170Ap each have an external shape not overlapping any of the plurality of extending portions Ep as seen in a plan view. Since such a positional arrangement or such a shape is adopted for the first external electrode 170An and the second external electrode 170Ap, the occurrence of a leak is suppressed more advantageously.

(Relationship Between the Shape of the External Electrode and the Positional Arrangement of the Plurality of Extending Portions)

Hereinafter, the relationship between the shape of each of the first external electrode 170An and the second external electrode 170Ap and the positional arrangement of the plurality of extending portions Ep will be described in more detail.

Figure 15:
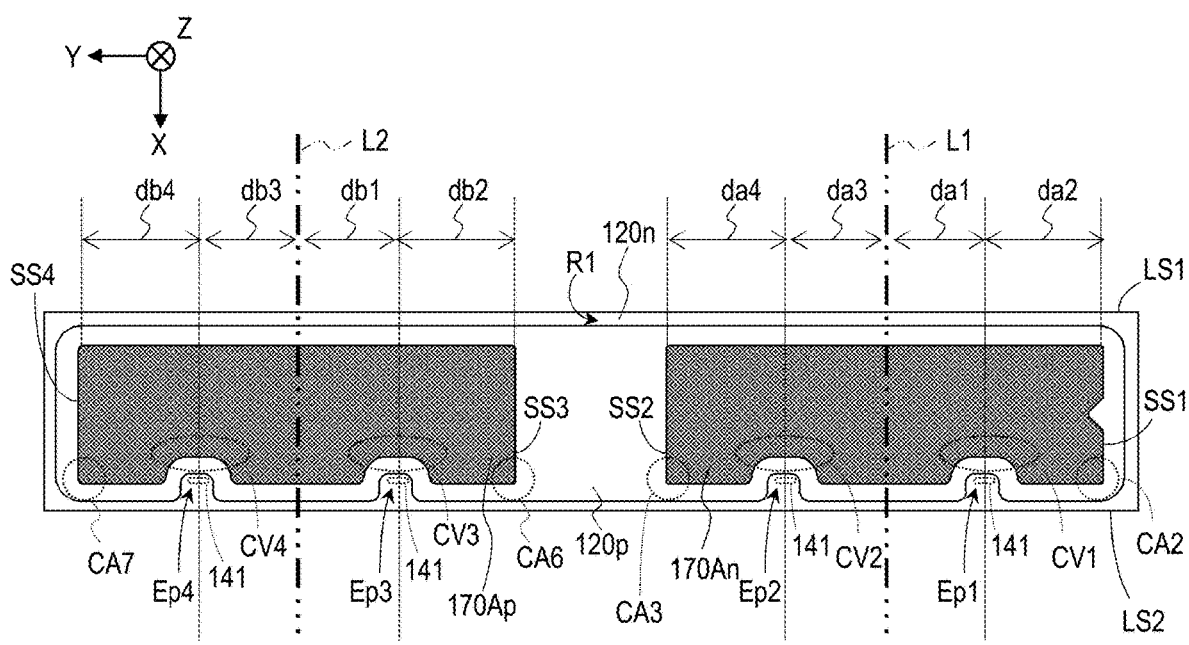
FIG. 15 is a view provided to describe an example of relationship between the shape of each of the first external electrode 170An and the second external electrode 170Ap and the positional arrangement of the plurality of extending portions Ep.

FIG. 15 is provided to describe an example of relationship between the shape of each of the first external electrode 170An and the second external electrode 170Ap and the positional arrangement of the plurality of extending portions Ep. Like FIG. 10, FIG. 15 shows the semiconductor structure 112A, the first external electrode 170An and the second external electrode 170Ap, among the components of the light emitting element 100A.

In the structure shown in FIG. 15, the first external electrode 170An and the second external electrode 170Ap each have a generally rectangular external shape. In this example, the external shape of the first external electrode 170An includes a set of shorter sides, more specifically, a first shorter side SS1 and a second shorter side SS2 facing each other. Similarly, in this example, the external shape of the second external electrode 170Ap includes a set of shorter sides, more specifically, a third shorter side SS3 and a fourth shorter side SS4 facing each other. In this example, the first external electrode 170An and the second external electrode 170Ap each have a generally rectangular external shape as seen in a plan view. The shapes of the first external electrode 170An and the second external electrode 170Ap as seen in a plan view do not need to match each other.

In the example shown in FIG. 15, the first through fourth shorter sides SS1 through SS4 are all perpendicular to the second longer side LS2 of the rectangular external shape of the n-type semiconductor layer 120*n*. As shown in FIG. 15, the first shorter side SS1 is located farther from the second external electrode 170Ap than the second shorter side SS2 is, and the third shorter side SS3 is located closer to the first external electrode 170An than the fourth shorter side SS4 is.

In this example, the first region R1 of the n-type semiconductor layer 120*n* includes the first through fourth extending portions Ep1 through Ep4. As schematically shown in FIG. 15, a first imaginary line L1 perpendicular to the second longer side LS2 of the external shape of the n-type semiconductor layer 120*n* and passing through the center of the rectangular external shape of the first external electrode 170An as seen in a plan view is assumed. The extending portion Ep1 as the first extending portion is located between the first imaginary line L1 and the first shorter side SS1. The extending portion Ep2 as the second extending portion is located between the first imaginary line L1 and the second shorter side SS2. Therefore, in this example, the first through-hole 141 provided on the extending portion Ep1 and the recessed portion CV1 of the first external electrode 170An are also located between the first imaginary line L1 and the first shorter side SS1. The first through-hole 141 provided on the extending portion Ep2 and the recessed portion CV2 of the first external electrode 170An are also located between the first imaginary line L1 and the second shorter side SS2.

Similarly, a second imaginary line L2 perpendicular to the second longer side LS2 and passing through the center of the rectangular external shape of the second external electrode 170Ap as seen in a plan view is assumed. The extending portion Ep3 as the third extending portion is located between the second imaginary line L2 and the third shorter side SS3. The extending portion Ep4 as the fourth extending portion is located between the second imaginary line L2 and the fourth shorter side SS4. The first through-hole 141 provided on the extending portion Ep3 and the recessed portion CV3 of the second external electrode 170Ap are also located between the second imaginary line L2 and the third shorter side SS3. The first through-hole 141 provided on the extending portion Ep4 and the recessed portion CV4 of the second external electrode 170Ap are also located between the second imaginary line L2 and the fourth shorter side SS4.

In the structure shown in FIG. 15, a distance represented by two-headed arrow da1 between the extending portion Ep1 and the first imaginary line L1 is shorter than a distance represented by two-headed arrow da2 between the extending portion Ep1 and the first shorter side SS1. Herein, the "distance between an extending portion and a imaginary line or a side" is a distance from the center of the extending portion to the imaginary line or the side measured along the second longer side LS2. In this example, as seen in a plan view, the extending portion Ep1 is located farther from the first shorter side SS1, along which the corner portion CA2 of the first external electrode 170An is located, than from the first imaginary line L1 passing through the center of the first external electrode 170An. With such a structure, the influence exerted on the extending portion Ep1 and the vicinity thereof by the heat stress caused in the corner portion CA2 may be decreased. Similarly, in the example shown in FIG. 15, a distance represented by two-headed arrow da3 between the extending portion Ep2 and the first imaginary line L1 is shorter than a distance represented by two-headed arrow da4 between the extending portion Ep2 and the second shorter side SS2. Namely, the extending portion Ep2 is located farther from the second shorter side SS2, along which the corner portion CA3 of the first external electrode 170An is located, than from the first imaginary line L1. With such a structure, an effect of suppressing a leak from being caused by the heat stress in the corner portion CA3 is expected.

In this example, a positional arrangement similar to that of the extending portions Ep1 and Ep2 is adopted for the extending portions Ep3 and Ep4. This will be described more specifically. The second imaginary line L2 perpendicular to the second longer side LS2 and passing through the center of the rectangular external shape of the second external electrode 170Ap as seen in a plan view is assumed. The extending portion Ep3 is located between the second imaginary line L2 and the third shorter side SS3. As schematically shown in FIG. 15, a distance represented by two-headed arrow db1 between the extending portion Ep3 and the second imaginary line L2 is shorter than a distance represented by two-headed arrow db2 between the extending portion Ep3 and the third shorter side SS3. The extending portion Ep3 is located farther from the third shorter side SS3, along which the corner portion CA6 of the second external electrode 170Ap is located, than from the second imaginary line L2. A distance represented by two-headed arrow db3 between the extending portion Ep4 and the second imaginary line L2 is shorter than a distance represented by two-headed arrow db4 between the extending portion Ep4 and the fourth shorter side SS4. The extending portion Ep4 is located farther from the fourth shorter side SS4, along which the corner portion CA7 of the second external electrode 170Ap is located, than from the second imaginary line L2. With such a structure, an effect of suppressing a leak from being caused in the extending portion Ep3 or Ep4 by the heat stress in the corner portion CA6 or CA7 is expected.

(Modification)

Figure 16:
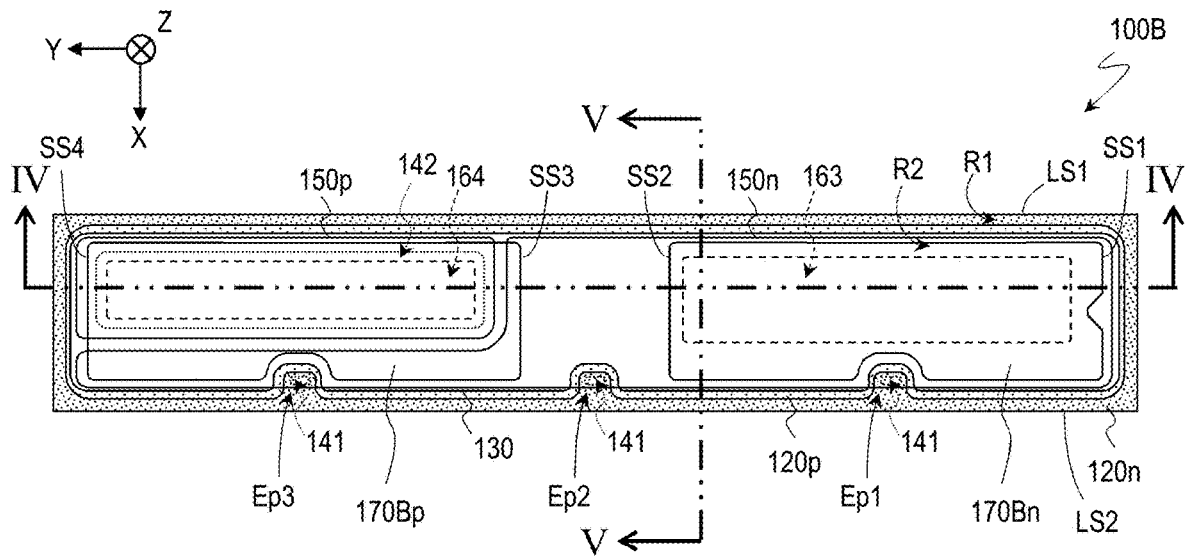
FIG. 16 is a schematic see-through view showing another example of light emitting element (100B) in an embodiment according to the present disclosure.

FIG. 16 shows another example of light emitting element in an embodiment according to the present disclosure. FIG. 16 shows a light emitting element 100B, which is another example of the light emitting element 100 described above with reference to FIG. 1 and FIG. 2. FIG. 16 is a schematic bottom see-through view of the light emitting element 100B, like FIG. 3. A cross-sectional view taken along line IV-IV in FIG. 16 and a cross-sectional view taken along line V-V in FIG. 16 may be substantially the same as the cross-sectional views in FIG. 4 and FIG. 5, respectively. Thus, the cross-sectional views taken along line IV-IV and line V-V in FIG. 16 will not be shown, and the structures in these cross-sectional views will not be described.

The light emitting element 100B shown in FIG. 16 includes a first external electrode 170Bn and a second external electrode 170Bp instead of the first external electrode 170An and the second external electrode 170Ap included in the light emitting element 100A described above with reference to FIG. 3 and the like. In the structure shown in FIG. 16, the first external electrode 170Bn has a generally rectangular external shape including a set of shorter sides, more specifically, a first shorter side SS1 and a second shorter side SS2 facing each other. Similarly, the second external electrode 170Bp has a generally rectangular external shape including a set of shorter sides, more specifically, a third shorter side SS3 and a fourth shorter side SS4 facing each other. The first through fourth shorter sides SS1 through SS4 are all perpendicular to the second longer side LS2 of the rectangular external shape of the n-type semiconductor layer 120n.

Figure 17A:
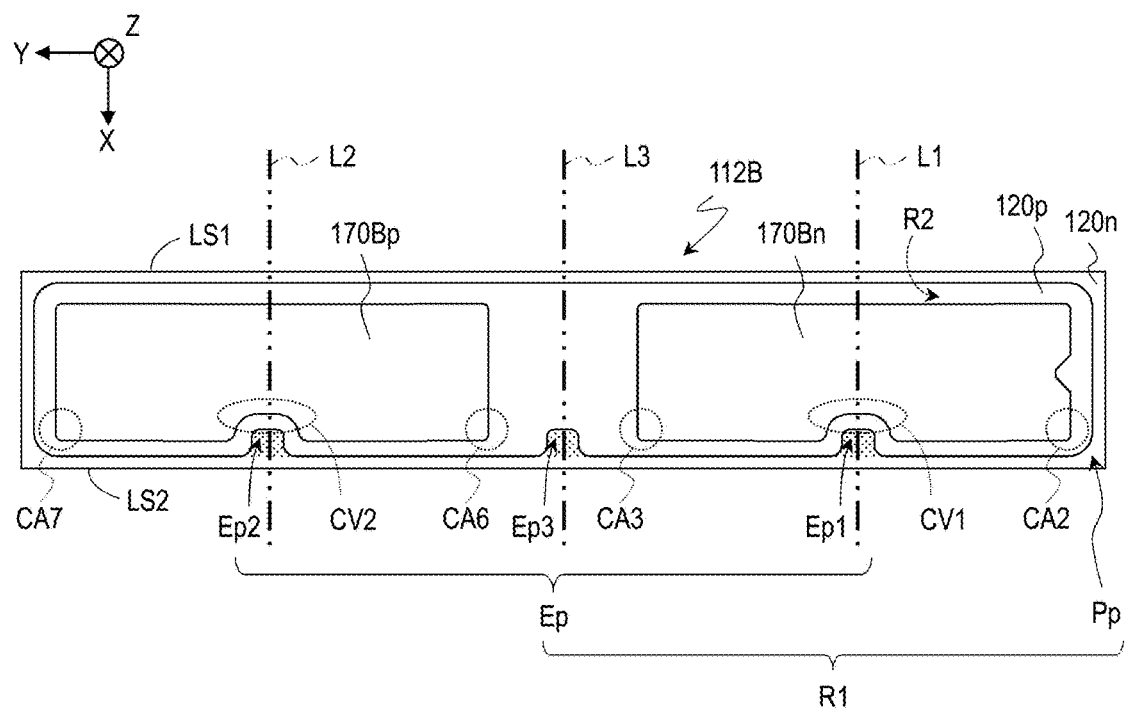
FIG. 17A is a schematic plan view showing a semiconductor structure, a first external electrode 170Bn and a second external electrode 170Bp among components of the light emitting element 100B shown in FIG. 16.

FIG. 17A schematically shows a semiconductor structure, the first external electrode 170Bn and the second external electrode 170Bp, among the components of the light emitting element 100B shown in FIG. 16. The semiconductor structure 112B shown in FIG. 17A includes the n-type semiconductor layer 120n including a first region R1 and a second region R2, the active layer 120a (not shown in FIG. 17A) located on the second region R2 of the n-type semiconductor layer 120n, and the p-type semiconductor layer 120p located on the active layer 120a. Like in the above-described examples, the first region R1 of the n-type semiconductor layer 120n includes an outer peripheral region Pp located along an outer perimeter of the second region R2 as seen in a plan view and a plurality of extending portions Ep extending into the second region R2 from the outer peripheral region Pp.

In this example, the first region R1 of the n-type semiconductor layer 120n includes three extending portions Ep1 through Ep3 located in series along the second longer side LS2 of the n-type semiconductor layer 120n. FIG. 17A shows areas that correspond to the extending portions Ep1 through Ep3 of the first region R1 as shaded areas, like FIG. 6. Among the extending portions Ep1 through Ep3, the extending portion Ep3 is located between the first external electrode 170Bn and the second external electrode 170Bp as seen in a plan view. In the example shown in FIG. 16 and FIG. 17A, the p-type semiconductor layer 120p and the active layer 120a each have a smaller area removed than in the examples described above with reference to FIG. 3 through FIG. 15. This is advantageous from the point of view of suppressing a decrease in the size of an area involved in light emission.

In the structure shown in FIG. 17A, the extending portion Ep1 is located on an imaginary line L1 perpendicular to the second longer side LS2 of the external shape of the n-type semiconductor layer 120n and passing through the center of the rectangular external shape of the first external electrode 170Bn. The extending portion Ep2 is located on an imaginary line L2 perpendicular to the second longer side LS2 and passing through the center of the rectangular external shape of the second external electrode 170Bp. Since such a positional arrangement is adopted, the extending portion Ep1 may be located far from the corner portions CA2 and CA3 of the first external electrode 170Bn, and the extending portion Ep2 may be located far from the corner portions CA6 and CA7 of the second external electrode 170Bp. In this example, the extending portion Ep3 is located on a third imaginary line L3 perpendicular to the second longer side LS2 and passing through the center of the second longer side LS2.

As schematically shown in FIG. 17A, in this example, the rectangular external shape of the first external electrode 170Bn includes a recessed portion CV1 as the first recessed portion at a position corresponding to the extending portion Ep1 as seen in a plan view. The rectangular external shape of the second external electrode 170Bp includes a recessed portion CV2 as the second recessed portion at a position corresponding to the extending portion Ep2 as seen in a plan view. Namely, in this example also, the first external electrode 170Bn and the second external electrode 170Bp each have a shape that does not overlap any of the plurality of extending portions Ep1 through Ep3 as seen in a plan view.

Like in the examples described above with reference to FIG. 3 through FIG. 15, in the example shown in FIG. 16 and FIG. 17A also, the extending portion Ep, on which a conductive component electrically connecting the n-type semiconductor layer 120n and the first internal electrode 150n to each other may be provided, is located in an area other than areas overlapping the corner portions of the first external electrode 170Bn and other than areas overlapping the corner portions of the second external electrode 170Bp. Such a positional arrangement may suppress short-circuiting from occurring between, for example, the light-reflective electrode 130 and the first internal electrode 150n due to the heat stress caused in the first external electrode 170Bn or the second external electrode 170Bp.

FIG. 17B shows still another example of light emitting element in an embodiment according to the present disclosure. FIG. 17B shows a light emitting element 100C, which is still another example of the light emitting element 100 described above with reference to FIG. 1 and FIG. 2. FIG. 17B is a schematic bottom see-through view of the light emitting element 100C, like FIG. 3 and FIG. 16.

The light emitting element 100C shown in FIG. 17B includes a first external electrode 170Cn and a second external electrode 170Cp instead of the first external electrode 170Bn and the second external electrode 170Bp included in the light emitting element 100B described above with reference to FIG. 16. The first external electrode 170Cn and the second external electrode 170Cp respectively have substantially the same structures as those of the first external electrode 170Bn and the second external electrode 170Bp except for the external shapes. In FIG. 17B, the first external electrode 170Cn and the second external electrode 170Cp are hatched so that the shapes thereof are better understood.

In the structure shown in FIG. 17B, a distance, in a longer direction (longitudinal direction) of the n-type semiconductor layer 120n having the rectangular external shape, between an outer perimeter of the light-reflective electrode 130 and an outer perimeter of the external electrode (the first external electrode 170Cn or the second external electrode 170Cp) is longer than a distance, in a shorter direction (transverse direction) of the n-type semiconductor layer 120 having the rectangular external shape, between the outer perimeter of the light-reflective electrode 130 and the outer perimeter of the external electrode. For example, the distance between the outer perimeter, along the shorter side of the n-type semiconductor layer 120n, of the light-reflective electrode 130 and the outer perimeter, along the shorter side of the n-type semiconductor layer 120n, of the second external electrode 170Cp (in FIG. 17B, the distance is schematically shown by two-headed arrow Lg) is longer than the distance between the outer perimeter, along the longer side of the n-type semiconductor layer 120n, of the light-reflective electrode 130 and the outer perimeter, along the longer side of the n-type semiconductor layer 120n, of the second external electrode 170Cp (in FIG. 17B, the distance is schematically shown by two-headed arrow Sg). Similarly, the distance between the outer perimeter, along the shorter side of the n-type semiconductor layer 120n, of the light-reflective electrode 130 and the outer perimeter, along the shorter side of the n-type semiconductor layer 120n, of the first external electrode 170Cn may be longer than the distance between the outer perimeter, along the longer side of the n-type semiconductor layer 120n, of the light-reflective electrode 130 and the outer perimeter, along the longer side of the n-type semiconductor layer 120n, of the first external electrode 170Cn.

A light emitting element having a rectangular external shape as seen in a plan view may possibly be warped, at an end thereof, in a −Z direction in the figures. In the case where a light emitting element warped in this manner is mounted on a member including a wiring (e.g., the support 200 described above) by the eutectic bonding, the wiring and the electrodes in the light emitting element are bonded to each other. As a result, a stress is applied to the end of the light emitting element in such a direction as to correct the warp. In this case, as the electrodes, in the light emitting elements, bonded with the wiring by eutectic bonding have a larger surface area size, a larger bonding strength is obtained but the load applied to the end of the light emitting element is larger. According to the studies made by the present inventors, this stress may be increased as being farther from the center of the light emitting element. Therefore, a crack may be generated in the light emitting element, especially, at a position close to the shorter side of the rectangular external shape thereof, by the stress caused by the eutectic bonding.

In the example shown in FIG. 17B, the distance from the outer perimeter of the light-reflective electrode 130 to the outer perimeter of the external electrode is longer in the longer direction of the rectangular shape of the light emitting element than in the shorter direction of the light emitting element. Such a structure provides an effect of alleviating the stress applied, by the eutectic bonding, to a position close to the shorter side of the rectangular shape of the light emitting element, and therefore, decreases the possibility of the generation of the crack. The first external electrode 170Cn may have a surface area size smaller than that of the first external electrode 170Bn. Similarly, the second external electrode 170Cp may have a surface area size smaller than that of the second external electrode 170Bp.

In the example shown in FIG. 17B, the distance between the outer perimeter, along the shorter side of the n-type semiconductor layer 120n, of the light-reflective electrode 130 and the outer perimeter, along the shorter side of the n-type semiconductor layer 120n, of the external electrode is in the range of, for example, 3% or higher and 7% or lower, preferably in the range of 4% or higher and 5% or lower, of the length of the light emitting element in the longer direction (X direction in FIG. 17B). The distance represented by the two-headed arrow Lg in FIG. 17B may be, for example, about 40 µm to about 50 µm. By contrast, the distance between the outer perimeter, along the longer side of the n-type semiconductor layer 120n (e.g., along the second longer side LS2), of the light-reflective electrode 130 and the outer perimeter, along the longer side of the n-type semiconductor layer 120n (e.g., along the second longer side LS2), of the external electrode is, for example, in the range of 10% or higher and 15% or lower, preferably in the range of 12% or higher and 15% or lower, of the length of the light emitting element in the shorter direction (Y direction in FIG. 17B). The distance represented by the two-headed arrow Sg in FIG. 17B may be, for example, about 20 µm to about 30 µm. The distance between the outer perimeter, along the second longer side LS2, of the light-reflective electrode 130 and the outer perimeter, along the second longer side LS2, of the external electrode may be equivalent to the distance between the outer perimeter, along the first longer side LS1, of the light-reflective electrode 130 and the outer perimeter, along the first longer side LS1, of the external electrode.

In general, a light emitting element is warped less along the shorter direction (X direction in FIG. 17B) than along the longer direction (Y direction in the figures). Therefore, even if the outer perimeter of the external electrode is located close to the outer perimeter of the light-reflective electrode 130 in the shorter direction, the light emitting element is not easily cracked. The outer perimeter of the external electrode may be located close to the outer perimeter of the light-reflective element 130 in the shorter direction of the light emitting element (X direction in FIG. 17B), so that the external electrode avoids having an excessively small surface area size, and thus the bonding strength is suppressed from being excessively decreased.

The distance between the outer perimeter of the light-reflective electrode 130 and the outer perimeter of the external electrode at the position of the extending portion Ep (extending portion Ep1 or Ep3) of the n-type semiconductor layer 120n (in FIG. 17B, the distance is schematically represented by two-headed arrow Mg) may be shorter than the distance represented by the two-headed arrow Sg. The distance between the outer perimeter of the light-reflective electrode 130 and the outer perimeter of the external electrode at the position of the extending portion Ep may be, for example, about 10 µm to about 20 µm. As described above, the stress applied to the end of the light emitting element close to the longer side thereof tends to be smaller than the stress applied to the end of the light emitting element close to the shorter side thereof. Therefore, the outer perimeter of the external electrode may be located close to the outer perimeter of the light-reflective electrode 130 in the shorter direction (X direction in FIG. 17B) with less problem. As in this example, the distance between the outer perimeter of the light-reflective electrode 130 and the outer perimeter of the external electrode may be shorter at the position of, for example, the extending portion Ep, than at the other positions, so that the load applied to the end of the light emitting element by the stress on the light emitting element is suppressed from increasing while the surface area size of the external electrode avoids being excessively decreased. Namely, the bonding strength may be suppressed from being excessively decreased by a decrease in the surface area size of the external electrode.

EXAMPLES

The magnitude of a shear stress applied on an external electrode was evaluated by a simulation, and thus the relationship between the shape of the external electrode as seen in a plan view and the area on which the heat stress is likely to be concentrated was investigated. Hereinafter, this will be described.

Reference Example 1

As a shape of an external electrode as seen in a plan view, the shape of the first external electrode 170An and the second external electrode 170Ap shown in FIG. 10 and the like each having two recessed portions corresponding to two extending portions was assumed. In the case in which a light emitting element is mounted on a support by eutectic bonding, the temperature is decreased during a reflow. At this point, a stress is caused in a surface of the semiconductor layer. This stress was calculated. The value obtained by the calculation is a shear stress $\tau_{YX}$ in the X direction of an XZ plane. The drawings to be referred to hereinafter show the strength of the shear stress by the darkness/lightness of the color based on an absolute value of $\tau_{YX}$. $\tau_{YX}$ is one of components of stress tensor. In reference examples 1 through 4 described below, the calculation conditions are the same. In FIG. 18 through FIG. 21, the same value of shear stress is shown with the same darkness/lightness.

Figure 18:
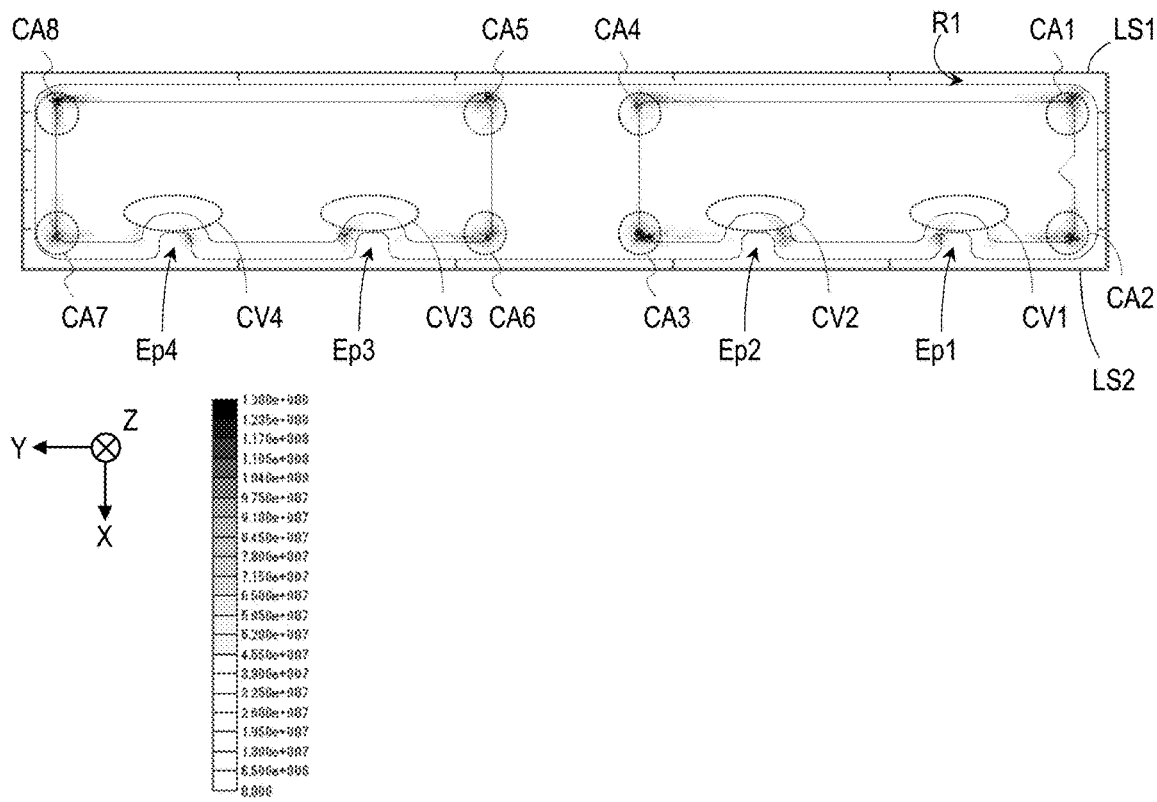
FIG. 18 shows calculation results on absolute values of shear stress on a sample in reference example 1.

FIG. 18 shows the results of calculation on a sample of reference example 1. In FIG. 18, dark areas represent areas with a large absolute value of shear stress. A relatively large heat stress is applied to these areas. It has been found based on the results shown in FIG. 18 that in the case in which, for example, a rectangular shape is adopted as an external shape of the external electrode, it is highly possible that the stress is concentrated especially on the corner portions CA1 through CA8 in a step of bonding the light emitting element to the support 200 or the like. It has also been found that the heat stress on a side connecting two corner portions is relatively small.

Reference Example 2

As a shape of an external electrode as seen in a plan view, the shape of the first external electrode 170Bn and the second external electrode 170Bp shown in FIG. 17A and the like each having one recessed portion corresponding to one extending portion was assumed. The absolute values of shear stress $\tau_{YX}$ were calculated in substantially the same manner as for the sample in reference example 1.

Figure 19:
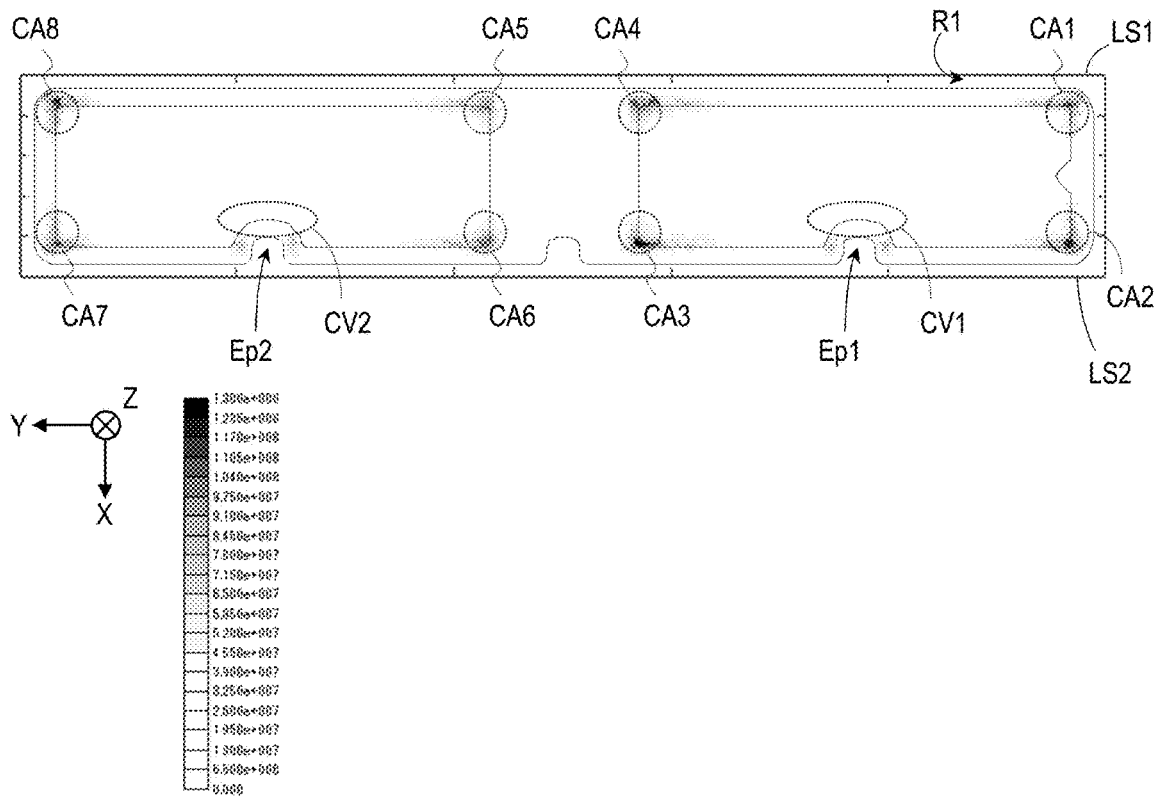
FIG. 19 shows calculation results on absolute values of shear stress on a sample in reference example 2.

FIG. 19 shows the results of calculation on a sample of reference example 2. Like in the case of the results shown in FIG. 18, it has been found based on the results shown in FIG. 19 that it is highly possible that the stress is concentrated especially on the corner portions CA1 through CA8 of the external electrode.

Reference Example 3

As in the example described above with reference to FIG. 13, it was assumed to locate extending portions of the n-type semiconductor layer at positions overlapping the corner portions of a rectangular external electrode. The absolute values of shear stress $\tau_{YX}$ were calculated in substantially the same manner as for the sample in reference example 1.

Figure 20:
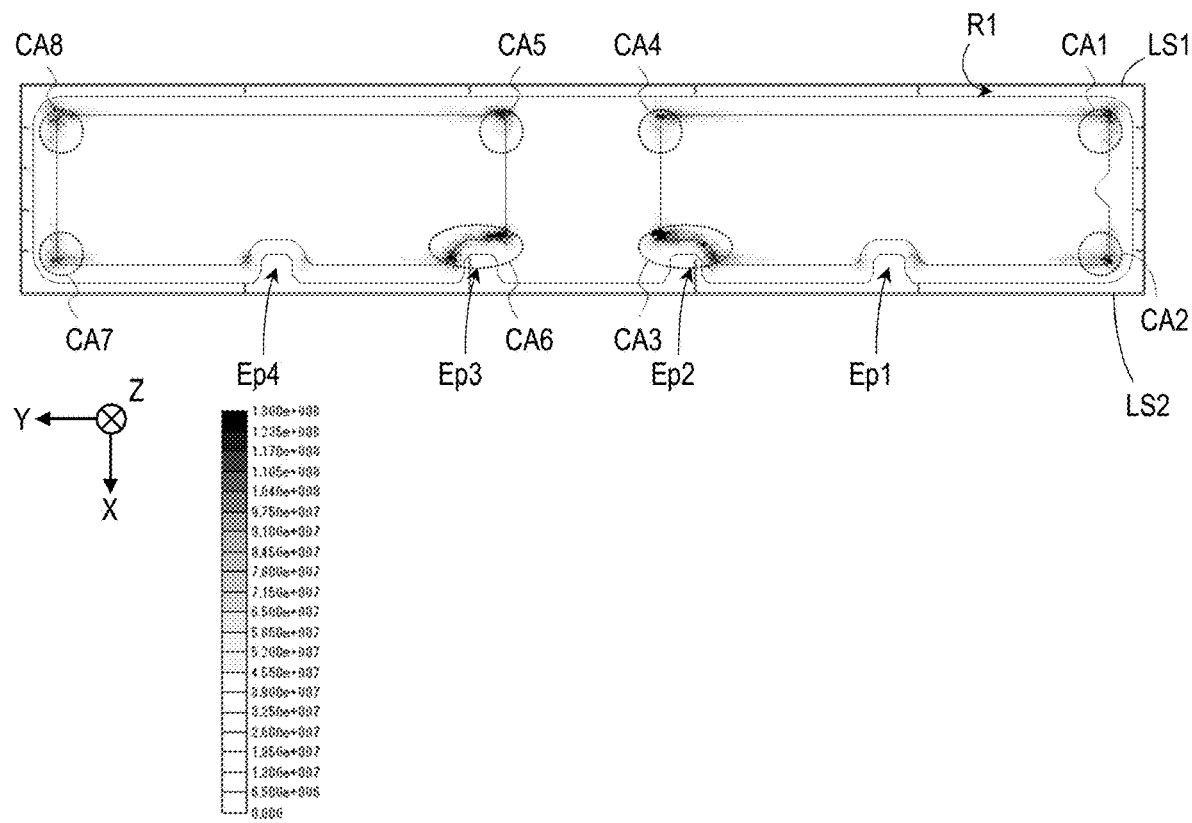
FIG. 20 shows calculation results on absolute values of shear stress on a sample in reference example 3.

FIG. 20 shows the results of calculation on a sample of reference example 3. It has been found based on the results shown in FIG. 20 that the heat stress may be more concentrated on the extending portion Ep2 overlapping the corner portion CA3 of the rectangular external electrode and the vicinity thereof, and also on the extending portion Ep3 overlapping the corner portion CA6 of the rectangular external electrode and the vicinity thereof, than on the extending portions Ep1 and Ep4 located on a side of the rectangular external electrode.

Reference Example 4

A semiconductor structure including no extending portion in the n-type semiconductor layer was assumed. The absolute values of shear stress $\tau_{YX}$ were calculated in substantially the same manner as for the sample in reference example 1.

Figure 21:
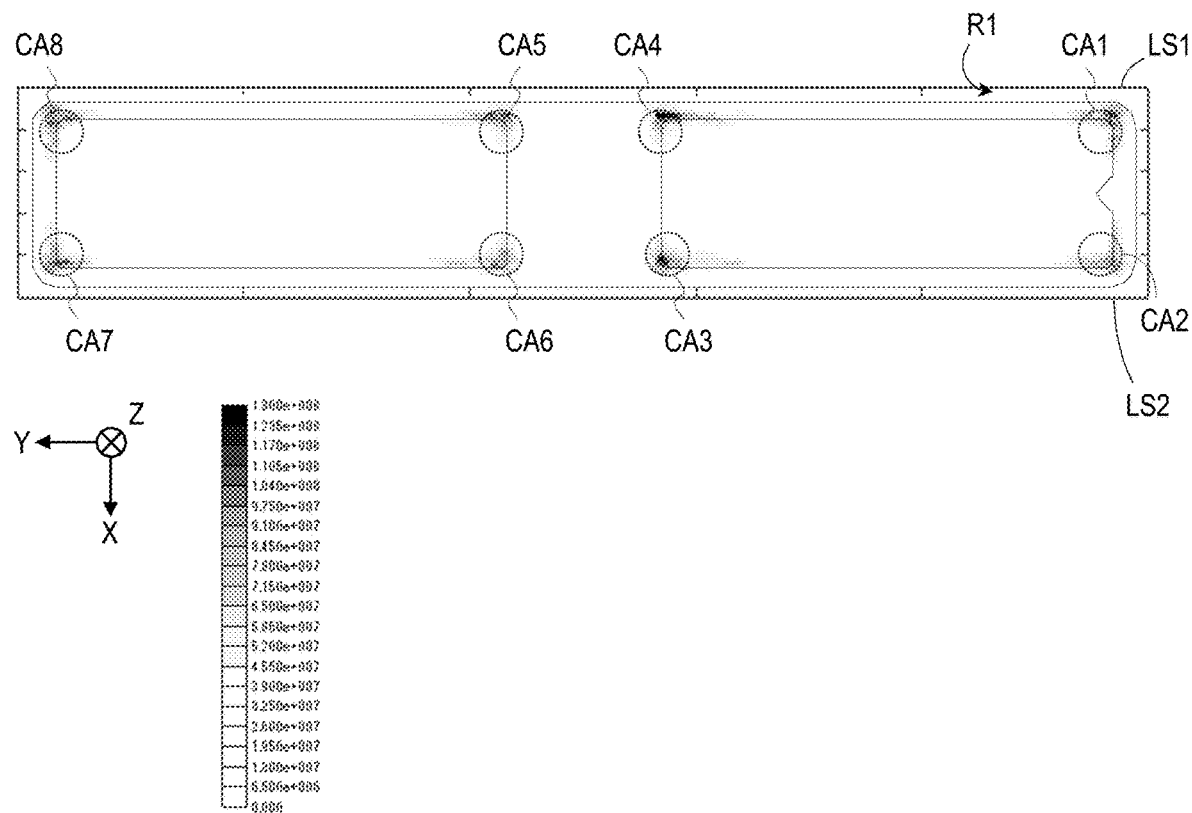
FIG. 21 shows calculation results on absolute values of shear stress on a sample in reference example 4.

FIG. 21 shows the results of calculation on a sample of reference example 4. It has been found based on the results shown in FIG. 21 that the heat stress is more likely to be concentrated at positions overlapping corner portions of the rectangular external electrode than at positions on a side of the rectangular external electrode.

From a comparison between the results shown in FIG. 20 and FIG. 21 and the results shown in FIG. 18 and FIG. 19, it has been found that in the case in which the extending portions are located on areas other than areas overlapping the corner portions of the external electrode, the shear stress on the extending portions and the vicinity thereof may be decreased, and thus the concentration of the heat stress on the extending portions and the vicinity thereof is avoided, so that a crack or the like is suppressed from being caused in the insulating layer at the positions corresponding to the extending portions. In an embodiment according to the present disclosure, the extending portions Ep are located in such areas that do not easily cause a leak. Therefore, the leak may be suppressed from being caused inside the light emitting structure.

A light emitting element and a light emitting device in an embodiment according to the present disclosure are useful for light sources for various lighting devices, on-board light sources, light sources for displays, and the like. A light emitting element and a light emitting device in an embodiment according to the present disclosure are especially advantageously usable for backlight units for liquid crystal display devices.

While exemplary embodiments of the present invention have been described, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting element, comprising:
a semiconductor structure comprising:
   a first semiconductor layer of a first conductivity type, the first semiconductor layer comprising a first region and a second region located inward of the first region,
   an active layer located on the second region, and
   a second semiconductor layer of a second conductivity type, the second semiconductor layer being located on the active layer,
   wherein the first region of the first semiconductor layer comprises:
      an outer peripheral region located along an outer perimeter of the second region in a plan view, and
      a plurality of extending portions, each extending into the second region from the outer peripheral region;
a first electrode covering a top surface of the second semiconductor layer;
a first insulating layer covering the semiconductor structure and the first electrode, wherein the extending portions of the first region and a portion of the first electrode located above part of the second region are exposed from the first insulating layer;
a first internal electrode located above the first insulating layer and electrically connected with the first semiconductor layer;
a second internal electrode located above the first insulating layer and electrically connected with the first electrode;
a second insulating layer covering the first internal electrode and the second internal electrode, the second insulating layer comprising:
   a first through-hole located above the first internal electrode, and
   a second through-hole located above the second internal electrode;
a first external electrode electrically connected with the first internal electrode via the first through-hole and comprising a plurality of corner portions; and
a second external electrode electrically connected with the second internal electrode via the second through-hole and comprising a plurality of corner portions,
wherein, in a plan view, the plurality of extending portions of the first region are each located in an area on a top surface of the first semiconductor layer other than an area overlapping any of the plurality of corner portions of the first external electrode and other than an area overlapping any of the plurality of corner portions of the second external electrode.

2. The light emitting element of claim 1,
wherein the first insulating layer includes a third through-hole located above the first electrode, at which said portion of the first electrode located above part of the second region is exposed from the first insulating layer,
wherein the second internal electrode is electrically connected with the first electrode via the third through-hole.

3. The light emitting element of claim 1,
wherein the first internal electrode is electrically connected with the first semiconductor layer at the positions of the extending portions.

4. The light emitting element of claim 1,
wherein the first semiconductor layer has a rectangular external shape in a plan view,
wherein the rectangular external shape comprises a first longer side and a second longer side facing each other, and
wherein the plurality of extending portions are located in series along the second longer side at a position closer to the second longer side than to the first longer side.

5. The light emitting element of claim 4, wherein each of the first external electrode and the second external electrode has a shape that does not overlap any of the plurality of extending portions in a plan view.

6. The light emitting element of claim 5,
wherein the first external electrode has a rectangular external shape comprising a first shorter side and a second shorter side facing each other and perpendicular to the second longer side,
wherein the second external electrode has a rectangular external shape comprising a third shorter side and a fourth shorter side facing each other and perpendicular to the second longer side,
wherein a distance between the first shorter side and the second external electrode is greater than a distance between the second shorter side and the second external electrode,
wherein a distance between the third shorter side and the first external electrode is smaller than a distance between the fourth shorter side and the first external electrode, and
wherein the plurality of extending portions include:
a first extending portion located between (i) a first imaginary line that is perpendicular to the second longer side and passes through a center of the rectangular external shape of the first external electrode, and (ii) the first shorter side,
a second extending portion located between (i) the first imaginary line, and (ii) the second shorter side,
a third extending portion located between (i) a second imaginary line that is perpendicular to the second longer side and passes through a center of the rectangular external shape of the second external electrode, and (ii) the third shorter side, and
a fourth extending portion located between (i) the second imaginary line and (ii) the fourth shorter side.

7. The light emitting element of claim 6,
wherein a distance between the first extending portion and the first imaginary line is shorter than a distance between the first extending portion and the first shorter side, and
wherein a distance between the second extending portion and the first imaginary line is shorter than a distance between the second extending portion and the second shorter side.

8. The light emitting element of claim 7,
wherein a distance between the third extending portion and the second imaginary line is shorter than a distance between the third extending portion and the third shorter side, and
wherein a distance between the fourth extending portion and the second imaginary line is shorter than a distance between the fourth extending portion and the fourth shorter side.

9. The light emitting element of claim 7,
wherein the first external electrode comprises:
a first recessed portion located at a position corresponding to the first extending portion in a plan view, and
a second recessed portion located at a position corresponding to the second extending portion in a plan view, and
wherein the second external electrode comprises:
a third recessed portion located at a position corresponding to the third extending portion in a plan view, and
a fourth recessed portion located at a position corresponding to the fourth extending portion in a plan view.

10. The light emitting element of claim 6,
wherein the first external electrode comprises:
a first recessed portion located at a position corresponding to the first extending portion in a plan view, and
a second recessed portion located at a position corresponding to the second extending portion in a plan view, and
wherein the second external electrode comprises:
a third recessed portion located at a position corresponding to the third extending portion in a plan view, and
a fourth recessed portion located at a position corresponding to the fourth extending portion in a plan view.

11. The light emitting element of claim 5,
wherein the first external electrode has a rectangular external shape comprising a first shorter side and a second shorter side facing each other and perpendicular to the second longer side,
wherein the second external electrode has a rectangular external shape comprising a third shorter side and a fourth shorter side facing each other and perpendicular to the second longer side, and
wherein the plurality of extending portions include:
a first extending portion located on a first imaginary line that is perpendicular to the second longer side and passes through a center of the rectangular external shape of the first external electrode, and
a second extending portion located on a second imaginary line that is perpendicular to the second longer side and passes through a center of the rectangular external shape of the second external electrode.

12. The light emitting element of claim 11,
wherein the first external electrode comprises a first recessed portion at a position corresponding to the first extending portion in a plan view, and
wherein the second external electrode comprises a second recessed portion at a position corresponding to the second extending portion in a plan view.

13. The light emitting element of claim 11, wherein the plurality of extending portions further include a third extending portion located between the first external electrode and the second external electrode, the third extending portion being located on a third imaginary line perpendicular to the second longer side and passing through a center of the second longer side.

14. The light emitting element of claim 4,
wherein the first external electrode has a rectangular external shape comprising a first shorter side and a second shorter side facing each other and perpendicular to the second longer side,
wherein the second external electrode has a rectangular external shape comprising a third shorter side and a fourth shorter side facing each other and perpendicular to the second longer side, wherein a distance between the first shorter side and the second external electrode is greater than a distance between the second shorter side and the second external electrode, wherein a distance between the third shorter side and the first external electrode is smaller than a distance between the fourth shorter side and the first external electrode, and wherein the plurality of extending portions include:
- a first extending portion located between (i) a first imaginary line that is perpendicular to the second longer side and passes through a center of the rectangular external shape of the first external electrode, and (ii) the first shorter side,
- a second extending portion located between (i) the first imaginary line, and (ii) the second shorter side,
- a third extending portion located between (i) a second imaginary line that is perpendicular to the second longer side and passes through a center of the rectangular external shape of the second external electrode, and (ii) the third shorter side, and
- a fourth extending portion located between (i) the second imaginary line and (ii) the fourth shorter side.

15. The light emitting element of claim 14,
wherein a distance between the first extending portion and the first imaginary line is shorter than a distance between the first extending portion and the first shorter side, and
wherein a distance between the second extending portion and the first imaginary line is shorter than a distance between the second extending portion and the second shorter side.

16. The light emitting element of claim 15,
wherein a distance between the third extending portion and the second imaginary line is shorter than a distance between the third extending portion and the third shorter side, and
wherein a distance between the fourth extending portion and the second imaginary line is shorter than a distance between the fourth extending portion and the fourth shorter side.

17. The light emitting element of claim 15,
wherein the first external electrode comprises:
- a first recessed portion located at a position corresponding to the first extending portion in a plan view, and
- a second recessed portion located at a position corresponding to the second extending portion in a plan view, and wherein the second external electrode comprises:
- a third recessed portion located at a position corresponding to the third extending portion in a plan view, and
- a fourth recessed portion located at a position corresponding to the fourth extending portion in a plan view.

18. The light emitting element of claim 14,
wherein the first external electrode comprises:
- a first recessed portion located at a position corresponding to the first extending portion in a plan view, and
- a second recessed portion located at a position corresponding to the second extending portion in a plan view, and wherein the second external electrode comprises:
- a third recessed portion located at a position corresponding to the third extending portion in a plan view, and
- a fourth recessed portion located at a position corresponding to the fourth extending portion in a plan view.

19. The light emitting element of claim 4,
wherein the first external electrode has a rectangular external shape comprising a first shorter side and a second shorter side facing each other and perpendicular to the second longer side,
wherein the second external electrode has a rectangular external shape comprising a third shorter side and a fourth shorter side facing each other and perpendicular to the second longer side, and
wherein the plurality of extending portions include:
- a first extending portion located on a first imaginary line that is perpendicular to the second longer side and passes through a center of the rectangular external shape of the first external electrode, and
- a second extending portion located on a second imaginary line that is perpendicular to the second longer side and passes through a center of the rectangular external shape of the second external electrode.

20. The light emitting element of claim 19,
wherein the first external electrode comprises a first recessed portion at a position corresponding to the first extending portion in a plan view, and
wherein the second external electrode comprises a second recessed portion at a position corresponding to the second extending portion in a plan view.

21. The light emitting element of claim 19, wherein the plurality of extending portions further include a third extending portion located between the first external electrode and the second external electrode, the third extending portion being located on a third imaginary line that is perpendicular to the second longer side and passes through a center of the second longer side.

22. The light emitting element of claim 4,
wherein the rectangular external shape of the first semiconductor layer comprises a shorter side located between the first longer side and the second longer side, and
wherein a distance between an outer perimeter, along the shorter side, of one of the first external electrode and the second external electrode and an outer perimeter, along the shorter side, of the first electrode is longer than a distance between an outer perimeter, along the second longer side, of the one of the first external electrode and the second external electrode and an outer perimeter, along the second longer side, of the first electrode.

23. A light emitting element, comprising:
a semiconductor structure comprising:
- a first semiconductor layer of a first conductivity type, the first semiconductor layer comprising a first region and a second region located inward of the first region,
- an active layer located on the second region, and
- a second semiconductor layer of a second conductivity type, the second semiconductor layer being located on the active layer, wherein the first region of the first semiconductor layer comprises:
- an outer peripheral region located along an outer perimeter of the second region in a plan view, and
- a plurality of extending portions, each extending into the second region from the outer peripheral region;

a light-reflective electrode located above the second semiconductor layer and electrically connected with the second semiconductor layer;
a first insulating layer covering the semiconductor structure and the light-reflective electrode and comprising:
a first through-hole located above the light-reflective electrode,
wherein the extending portions of the first region are exposed from the first insulating layer;
a first internal electrode located on the first insulating layer and electrically connected with the first semiconductor layer;
a second internal electrode located on the first insulating layer and electrically connected with the light-reflective electrode via the first through-hole;
a second insulating layer covering the first internal electrode and the second internal electrode, the second insulating layer comprising:
a second through-hole located on the first internal electrode, and
a third through-hole located on the second internal electrode;
a first external electrode electrically connected with the first internal electrode via the second through-hole and comprising a plurality of corner portions; and
a second external electrode electrically connected with the second internal electrode via the third through-hole and comprising a plurality of corner portions,
wherein, in a plan view, the plurality of extending portions of the first region are each located in an area on a top surface of the first semiconductor layer other than an area overlapping any of the plurality of corner portions of the first external electrode and other than an area overlapping any of the plurality of corner portions of the second external electrode.

24. The light emitting element of claim 23,
wherein the first internal electrode is electrically connected with the first semiconductor layer at the positions of the extending portions.

25. The light emitting element of claim 23,
wherein the first semiconductor layer has a rectangular external shape in a plan view,
wherein the rectangular external shape comprises a first longer side and a second longer side facing each other, and
wherein the plurality of extending portions are located in series along the second longer side at a position closer to the second longer side than to the first longer side.

26. The light emitting element of claim 25, wherein each of the first external electrode and the second external electrode has a shape that does not overlap any of the plurality of extending portions in a plan view.

27. The light emitting element of claim 26,
wherein the first external electrode has a rectangular external shape comprising a first shorter side and a second shorter side facing each other and perpendicular to the second longer side,
wherein the second external electrode has a rectangular external shape comprising a third shorter side and a fourth shorter side facing each other and perpendicular to the second longer side,
wherein a distance between the first shorter side and the second external electrode is greater than a distance between the second shorter side and the second external electrode,
wherein a distance between the third shorter side and the first external electrode is smaller than a distance between the fourth shorter side and the first external electrode, and
wherein the plurality of extending portions include:
a first extending portion located between (i) a first imaginary line that is perpendicular to the second longer side and passes through a center of the rectangular external shape of the first external electrode, and (ii) the first shorter side,
a second extending portion located between (i) the first imaginary line, and (ii) the second shorter side,
a third extending portion located between (i) a second imaginary line that is perpendicular to the second longer side and passes through a center of the rectangular external shape of the second external electrode, and (ii) the third shorter side, and
a fourth extending portion located between (i) the second imaginary line and (ii) the fourth shorter side.

28. The light emitting element of claim 27,
wherein a distance between the first extending portion and the first imaginary line is shorter than a distance between the first extending portion and the first shorter side, and
wherein a distance between the second extending portion and the first imaginary line is shorter than a distance between the second extending portion and the second shorter side.

29. The light emitting element of claim 28,
wherein a distance between the third extending portion and the second imaginary line is shorter than a distance between the third extending portion and the third shorter side, and
wherein a distance between the fourth extending portion and the second imaginary line is shorter than a distance between the fourth extending portion and the fourth shorter side.

30. The light emitting element of claim 28,
wherein the first external electrode comprises:
a first recessed portion located at a position corresponding to the first extending portion in a plan view, and
a second recessed portion located at a position corresponding to the second extending portion in a plan view, and
wherein the second external electrode comprises:
a third recessed portion located at a position corresponding to the third extending portion in a plan view, and
a fourth recessed portion located at a position corresponding to the fourth extending portion in a plan view.

31. The light emitting element of claim 27,
wherein the first external electrode comprises:
a first recessed portion located at a position corresponding to the first extending portion in a plan view, and
a second recessed portion located at a position corresponding to the second extending portion in a plan view, and
wherein the second external electrode comprises:
a third recessed portion located at a position corresponding to the third extending portion in a plan view, and
a fourth recessed portion located at a position corresponding to the fourth extending portion in a plan view.

32. The light emitting element of claim 26,
wherein the first external electrode has a rectangular external shape comprising a first shorter side and a second shorter side facing each other and perpendicular to the second longer side,
wherein the second external electrode has a rectangular external shape comprising a third shorter side and a fourth shorter side facing each other and perpendicular to the second longer side, and
wherein the plurality of extending portions include:
   a first extending portion located on a first imaginary line that is perpendicular to the second longer side and passes through a center of the rectangular external shape of the first external electrode, and
   a second extending portion located on a second imaginary line that is perpendicular to the second longer side and passes through a center of the rectangular external shape of the second external electrode.

33. The light emitting element of claim 32,
wherein the first external electrode comprises a first recessed portion at a position corresponding to the first extending portion in a plan view, and
wherein the second external electrode comprises a second recessed portion at a position corresponding to the second extending portion in a plan view.

34. The light emitting element of claim 32, wherein the plurality of extending portions further include a third extending portion located between the first external electrode and the second external electrode, the third extending portion being located on a third imaginary line perpendicular to the second longer side and passing through a center of the second longer side.

35. The light emitting element of claim 25,
wherein the first external electrode has a rectangular external shape comprising a first shorter side and a second shorter side facing each other and perpendicular to the second longer side,
wherein the second external electrode has a rectangular external shape comprising a third shorter side and a fourth shorter side facing each other and perpendicular to the second longer side,
wherein a distance between the first shorter side and the second external electrode is greater than a distance between the second shorter side and the second external electrode,
wherein a distance between the third shorter side and the first external electrode is smaller than a distance between the fourth shorter side and the first external electrode, and
wherein the plurality of extending portions include:
   a first extending portion located between (i) a first imaginary line that is perpendicular to the second longer side and passes through a center of the rectangular external shape of the first external electrode, and (ii) the first shorter side,
   a second extending portion located between (i) the first imaginary line, and (ii) the second shorter side,
   a third extending portion located between (i) a second imaginary line that is perpendicular to the second longer side and passes through a center of the rectangular external shape of the second external electrode, and (ii) the third shorter side, and
   a fourth extending portion located between (i) the second imaginary line and (ii) the fourth shorter side.

36. The light emitting element of claim 35,
wherein a distance between the first extending portion and the first imaginary line is shorter than a distance between the first extending portion and the first shorter side, and
wherein a distance between the second extending portion and the first imaginary line is shorter than a distance between the second extending portion and the second shorter side.

37. The light emitting element of claim 36,
wherein a distance between the third extending portion and the second imaginary line is shorter than a distance between the third extending portion and the third shorter side, and
wherein a distance between the fourth extending portion and the second imaginary line is shorter than a distance between the fourth extending portion and the fourth shorter side.

38. The light emitting element of claim 36,
wherein the first external electrode comprises:
   a first recessed portion located at a position corresponding to the first extending portion in a plan view, and
   a second recessed portion located at a position corresponding to the second extending portion in a plan view, and
wherein the second external electrode comprises:
   a third recessed portion located at a position corresponding to the third extending portion in a plan view, and
   a fourth recessed portion located at a position corresponding to the fourth extending portion in a plan view.

39. The light emitting element of claim 35,
wherein the first external electrode comprises:
   a first recessed portion located at a position corresponding to the first extending portion in a plan view, and
   a second recessed portion located at a position corresponding to the second extending portion in a plan view, and
wherein the second external electrode comprises:
   a third recessed portion located at a position corresponding to the third extending portion in a plan view, and
   a fourth recessed portion located at a position corresponding to the fourth extending portion in a plan view.

40. The light emitting element of claim 25,
wherein the first external electrode has a rectangular external shape comprising a first shorter side and a second shorter side facing each other and perpendicular to the second longer side,
wherein the second external electrode has a rectangular external shape comprising a third shorter side and a fourth shorter side facing each other and perpendicular to the second longer side, and
wherein the plurality of extending portions include:
   a first extending portion located on a first imaginary line that is perpendicular to the second longer side and passes through a center of the rectangular external shape of the first external electrode, and
   a second extending portion located on a second imaginary line that is perpendicular to the second longer side and passes through a center of the rectangular external shape of the second external electrode.

41. The light emitting element of claim 40,
wherein the first external electrode comprises a first recessed portion at a position corresponding to the first extending portion in a plan view, and wherein the second external electrode comprises a second recessed portion at a position corresponding to the second extending portion in a plan view.

42. The light emitting element of claim 40, wherein the plurality of extending portions further include a third extending portion located between the first external electrode and the second external electrode, the third extending portion being located on a third imaginary line that is perpendicular to the second longer side and passes through a center of the second longer side.

43. The light emitting element of claim 25,
wherein the rectangular external shape of the first semiconductor layer comprises a shorter side located between the first longer side and the second longer side, and
wherein a distance between an outer perimeter, along the shorter side, of one of the first external electrode and the second external electrode and an outer perimeter, along the shorter side, of the light-reflective electrode is longer than a distance between an outer perimeter, along the second longer side, of the one of the first external electrode and the second external electrode and an outer perimeter, along the second longer side, of the light-reflective electrode.

* * * * *